United States Patent
Uchida et al.

(10) Patent No.: US 8,933,466 B2
(45) Date of Patent: Jan. 13, 2015

(54) SEMICONDUCTOR ELEMENT

(71) Applicant: Panasonic Corporation, Osaka (JP)

(72) Inventors: Masao Uchida, Osaka (JP); Nobuyuki Horikawa, Kyoto (JP); Koutarou Tanaka, Osaka (JP); Tsutomu Kiyosawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/349,024

(22) PCT Filed: Nov. 1, 2012

(86) PCT No.: PCT/JP2012/007010
§ 371 (c)(1),
(2) Date: Apr. 1, 2014

(87) PCT Pub. No.: WO2013/140473
PCT Pub. Date: Sep. 26, 2013

(65) Prior Publication Data
US 2014/0246682 A1     Sep. 4, 2014

(30) Foreign Application Priority Data
Mar. 23, 2012   (JP) .................... 2012-067817

(51) Int. Cl.
H01L 29/15     (2006.01)
H01L 29/16     (2006.01)
(Continued)

(52) U.S. Cl.
CPC ............ H01L 29/1608 (2013.01); H01L 29/78 (2013.01); H01L 27/0629 (2013.01)
USPC ............... 257/77; 257/288; 438/268

(58) Field of Classification Search
CPC ............ H01L 21/046; H01L 29/1608; H01L 29/66068; H01L 29/66666; H01L 29/7827; H01L 29/7802; H01L 29/1095

USPC ............ 257/77, 288, 607, E21.054, E29.255; 438/197, 268
See application file for complete search history.

(56) References Cited

U.S. PATENT DOCUMENTS 5,661,314 A   8/1997   Merrill et al.
5,904,510 A   5/1999   Merrill et al.
(Continued)

FOREIGN PATENT DOCUMENTS

JP   4-229660 A    8/1992
JP   06-338616 A   12/1994
(Continued)

OTHER PUBLICATIONS

International Search Report issued in PCT/JP2012/007010, dated Feb. 5, 2013, with English translation.

*Primary Examiner* — Khiem D Nguyen
(74) *Attorney, Agent, or Firm* — McDermott Will & Emery LLP

(57) ABSTRACT

In a semiconductor element, a body region of a second conductivity type includes a first body region in contact with a surface of a first silicon carbide semiconductor layer, and a second body region in contact with a bottom surface of the body region of the second conductivity type. The impurity concentration of the first body region is twice or more the impurity concentration of the second body region. A second silicon carbide semiconductor layer of a first conductivity type, which is a channel layer, has an impurity concentration distribution in a direction perpendicular to a semiconductor substrate, and an impurity concentration on a side in contact with the gate insulating film is lower than an impurity concentration on a side in contact with the first body region.

27 Claims, 13 Drawing Sheets

| (51) | Int. Cl. | |
|---|---|---|
| | *H01L 29/78* | (2006.01) |
| | *H01L 27/06* | (2006.01) |

(56) References Cited

U.S. PATENT DOCUMENTS

| | | | |
|---|---|---|---|
| 6,573,534 B1 * | 6/2003 | Kumar et al. | 257/77 |
| 7,282,739 B2 * | 10/2007 | Kaneko | 257/77 |
| 7,808,003 B2 * | 10/2010 | Endo et al. | 257/77 |
| 8,680,538 B2 * | 3/2014 | Tarui et al. | 257/77 |
| 2003/0107041 A1 * | 6/2003 | Tanimoto et al. | 257/77 |
| 2008/0224150 A1 | 9/2008 | Suzuki et al. | |
| 2010/0295060 A1 | 11/2010 | Kudou et al. | |
| 2011/0198616 A1 | 8/2011 | Yamashita | |
| 2011/0254016 A1 * | 10/2011 | Ryu | 257/77 |
| 2012/0057386 A1 | 3/2012 | Adachi et al. | |
| 2012/0139623 A1 | 6/2012 | Hashimoto et al. | |

FOREIGN PATENT DOCUMENTS

| | | |
|---|---|---|
| JP | 2002-270839 A | 9/2002 |
| JP | 2006-332232 A | 12/2006 |
| JP | 2008-017237 A | 1/2008 |
| JP | 2008-227151 A | 9/2008 |
| JP | 2009-190346 A | 8/2009 |
| JP | 2010-027833 A | 2/2010 |
| JP | 2010-267767 A | 11/2010 |
| WO | 2009/050871 A1 | 4/2009 |
| WO | 2010/044226 A1 | 4/2010 |
| WO | 2010-125819 A1 | 11/2010 |
| WO | 2011-021361 A1 | 2/2011 |

* cited by examiner (a)

(b)

(c)

(a)

(b)

(a)

(b)

SEMICONDUCTOR ELEMENT

RELATED APPLICATIONS

This application is the U.S. National Phase under 35 U.S.C. § 371 of International Application No. PCT/JP2012/007010, filed on Nov. 1, 2012, which in turn claims the benefit of Japanese Application No. 2012-067817, filed on Mar. 23, 2012, the disclosures of which Applications are incorporated by reference herein.

TECHNICAL FIELD

The present disclosure relates to semiconductor elements, and specifically relates to silicon carbide semiconductor elements (power semiconductor devices) which withstand high voltage or high current.

BACKGROUND ART

Silicon carbide (SiC) is a semiconductor material with high hardness, of which the band gap is larger than the band gap of silicon (Si), and is applied to various semiconductor devices, such as a power element, an environmentally-resistant element, a high-temperature operation element, and high-frequency element. Among these elements, application to power elements, such as a semiconductor element and a rectifier element is gaining attention. Power elements using SiC has an advantage that they can significantly reduce power loss, compared to power elements using Si. Further, SiC power elements allow fabrication of smaller semiconductor devices, since having such an advantage as described above, than Si power elements.

One of typical semiconductor elements among power elements using SiC is a metal-insulator-semiconductor field-effect transistor (MISFET). Hereinafter, the MISFET using SiC may be simply referred to as a "SiC-FET." A metal-oxide-semiconductor field-effect transistor (MOSFET) is one type of MISFETs.

Using the SiC-FET as a switching element for an electric power converter that drives and controls a load (e.g., a motor), for example, has been considered. In the case of using a MISFET as a switching element of an electric power converter, a freewheeling current may flow when the MISFET is in the off state. In commonly-used inverter circuits, a freewheeling diode is externally connected in antiparallel with the MISFET to ensure a path of the freewheeling current. In the case where the SiC-FET is applied to an inverter circuit, a Schottky diode made of SiC is selected as a freewheeling diode.

On the other hand, the MISFET includes a pn-junction in its structure, and functions as a diode between source and drain, and therefore called a "body diode." If a current can flow using the pn-junction existing in the SiC-FET when the channel of the MISFET is in the off state, it is possible to omit a freewheeling diode as an external device in the case where the MISFET is applied to an inverter circuit. As a result, the number of parts can be reduced. It is reported, however, that if a forward current flows in the SiC pn-junction, a problem unique to SiC occurs, that is, stacking faults increase due to basal plane dislocation. Using the pn-junction diode (i.e., a body diode) existing in the SiC-FET as a freewheeling diode causes a current to flow in the body diode, which is the pn-junction, in a forward direction. If such a current flows in the SiC pn-junction, it is expected that crystal deterioration of the SiC-FET (e.g., an increase in the stacking faults in the pn-junction) may proceed due to bipolar operation of the body diode (see, e.g., Patent Document 1).

On-state voltage of the body diode may increase when the crystal deterioration of the SiC-FET proceeds. Further, in the case where the body diode is used as a freewheeling diode, a reverse recovery current flows when the diode shifts from the on state to the off state, due to the bipolar operation of the pn-junction diode. The reverse recovery current causes a recovery loss, and leads to a reduction in switching speed.

As mentioned above, in the SiC-FET, a current flowing in the body diode may cause element deterioration due to an increase in recovery loss and an increase in stacking faults. It is therefore impossible to use the body diode as a freewheeling diode.

The inventors of the present application therefore previously invented a SiC-FET in which the channel structure of the SiC-FET is optimized and includes a function of diode in a channel portion, thereby allowing a current to flow from a source electrode to a drain through the channel portion that includes the diode function, without allowing the current to flow through the body diode, when the SiC-FET is in the off state (see Patent Document 2). With this structure, the external freewheeling diode can be omitted when the SiC-FET is applied to an inverter circuit. It is therefore possible to reduce the number of parts of the inverter circuit.

CITATION LIST

Patent Document

Patent Document 1: Japanese Unexamined Patent Publication No. 2008-17237

Patent Document 2: International Patent Publication No. WO 2010/125819

SUMMARY OF THE INVENTION

Technical Problem

In various types of transistors including the above-described SiC-FET, further property improvement, such as allowing more current to flow during on time when the SiC-FET is applied to a large current driving circuit, for example, is desired.

The present disclosure is therefore intended to increase a saturation current during on time in a semiconductor element. Particularly in the case where a diode function is included in the channel portion, as in the case of the above SiC-FET that is previously invented by the inventors of the present application, the objective of the present disclosure is to increase a saturation current during on time of the SiC-FET as a transistor, while maintaining characteristics of the diode included in the channel portion.

Solution to the Problem

To achieve the above objective, one aspect of the semiconductor element of the present disclosure includes: a semiconductor substrate of a first conductivity type; a first silicon carbide semiconductor layer of the first conductivity type located on a principal surface of the semiconductor substrate; a body region of a second conductivity type located in the first silicon carbide semiconductor layer; an impurity region of the first conductivity type located in the body region; a second silicon carbide semiconductor layer of the first conductivity type which is located on the first silicon carbide semiconductor layer and is in contact with at least part of the body region and at least part of the impurity region; a gate insulating film on the second silicon carbide semiconductor layer; a gate electrode on the gate insulating film; a first ohmic electrode electrically connected to the impurity region; and a second ohmic electrode provided on a back surface of the semiconductor substrate. The body region of the second conductivity type includes a first body region in contact with a surface of the first silicon carbide semiconductor layer, and a second body region in contact with a bottom surface of the body region of the second conductivity type. An impurity concentration of the first body region is twice or more an impurity concentration of the second body region. The second silicon carbide semiconductor layer of the first conductivity type has an impurity concentration distribution in a direction perpendicular to the semiconductor substrate, and an impurity concentration on a side in contact with the gate insulating film is lower than an impurity concentration on a side in contact with the first body region.

Another aspect of the semiconductor element of the present disclosure includes: a semiconductor substrate of a first conductivity type; a first silicon carbide semiconductor layer of the first conductivity type located on a principal surface of the semiconductor substrate; a body region of a second conductivity type located in the first silicon carbide semiconductor layer; an impurity region of the first conductivity type located in the body region; a second silicon carbide semiconductor layer of the first conductivity type which is located on the first silicon carbide semiconductor layer and is in contact with at least part of the body region and at least part of the impurity region; a gate insulating film on the second silicon carbide semiconductor layer; a gate electrode on the gate insulating film; a first ohmic electrode electrically connected to the impurity region; and a second ohmic electrode provided on a back surface of the semiconductor substrate. The body region of the second conductivity type includes a first body region in contact with a surface of the first silicon carbide semiconductor layer, and a second body region in contact with a bottom surface of the body region of the second conductivity type. An impurity concentration of the first body region is twice or more an impurity concentration of the second body region. The second silicon carbide semiconductor layer of the first conductivity type has an impurity concentration distribution in a direction perpendicular to the semiconductor substrate, and includes a first region on a side in contact with the gate insulating film, a second region on a side in contact with the first body region, and a third region of which an impurity concentration is higher than impurity concentrations of the first region and the second region.

Advantages of the Invention

According to the present disclosure, each of the channel layer and the body region has a multilayered structure as mentioned above. It is therefore possible to obtain a semiconductor element whose saturation current during on time is increased, thereby allowing a large current to flow. Particularly in the case of a SiC semiconductor element including a diode in a channel portion, the saturation current during on time in transistor operation can be increased without reducing the diode characteristics included in the channel portion.

DESCRIPTION OF EMBODIMENTS

Figure 1:
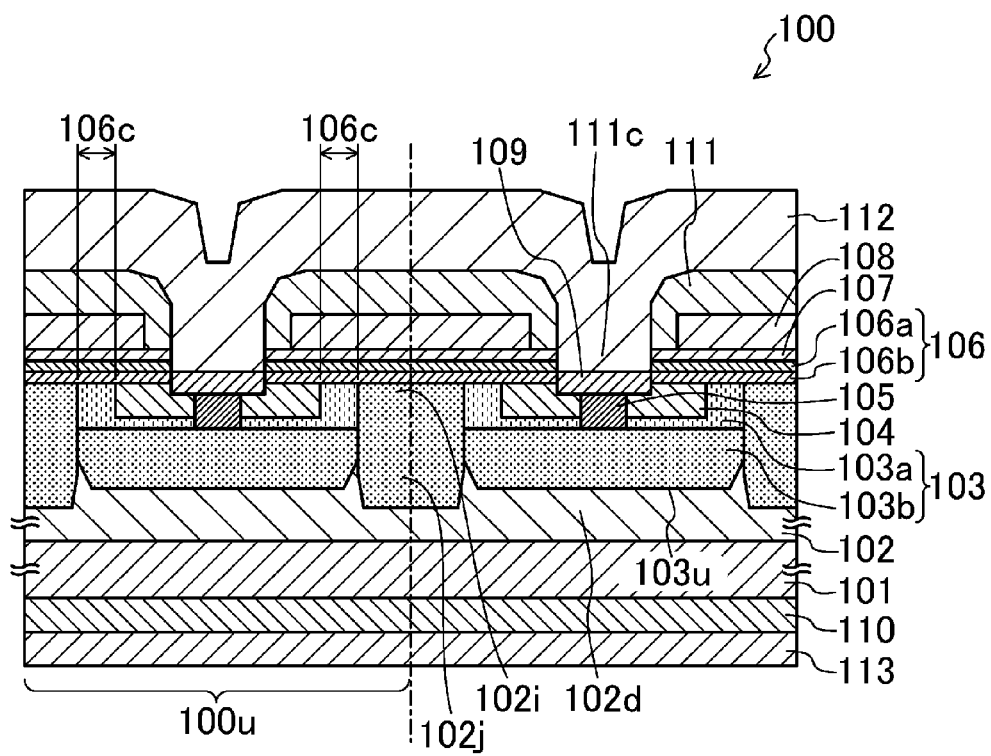
FIG. 1 is a cross section of a semiconductor element of an embodiment of the present disclosure.

A semiconductor element of an embodiment of the present disclosure includes: a semiconductor substrate of a first conductivity type; a first silicon carbide semiconductor layer of the first conductivity type located on a principal surface of the semiconductor substrate; a body region of a second conductivity type located in the first silicon carbide semiconductor layer; an impurity region of the first conductivity type located in the body region; a second silicon carbide semiconductor layer of the first conductivity type which is located on the first silicon carbide semiconductor layer and is in contact with at least part of the body region and at least part of the impurity region; a gate insulating film on the second silicon carbide semiconductor layer; a gate electrode on the gate insulating film; a first ohmic electrode electrically connected to the impurity region; and a second ohmic electrode provided on a back surface of the semiconductor substrate, wherein the body region of the second conductivity type includes a first body region in contact with a surface of the first silicon carbide semiconductor layer, and a second body region in contact with a bottom surface of the body region of the second conductivity type, and an impurity concentration of the first body region is twice or more an impurity concentration of the second body region, and the second silicon carbide semiconductor layer of the first conductivity type has an impurity concentration distribution in a direction perpendicular to the semiconductor substrate, and an impurity concentration on a side in contact with the gate insulating film is lower than an impurity concentration on a side in contact with the first body region.

In the present embodiment, the second silicon carbide semiconductor layer has an impurity concentration distribution, and the impurity concentration is lower near the gate insulating film than near the body region. Thus, a saturation current of the semiconductor element can be increased for the following reason. During on time of the semiconductor element, a region of the second silicon carbide semiconductor layer which is near the gate insulating film and serves as a channel layer can function as a path through which electrons as carriers can pass. The lower the impurity concentration is, the more the carrier mobility increases. Thus, the carrier mobility of the region near the gate insulating film which serves as a carrier path is higher than the other region. As a result, a saturation current of the semiconductor element can be increased.

In the present embodiment, the body region includes a first body region and a second body region located under the first body region, and the impurity concentration of the first body region is twice or more the impurity concentration of the second body region. Thus, the saturation current of the semiconductor element can be increased for the following reason. A region (referred to as a JFET region) in the first silicon carbide semiconductor layer of the first conductivity type between two adjacent body regions of the second conductivity type is connected to the channel region in series, and serves as a carrier path region during on time of the semiconductor element. Easiness for carriers to pass in the JFET region relates to the width of the effective JFET region. Specifically, the less a depletion layer expands in the JFET region due to a pn junction between the JFET region and the body region, the wider the width of the effective JFET region. According to the present embodiment, the expansion of the depletion layer extending from the pn junction between the JFET region and the body region to the JFET region is less in the first body region than in the second body region, due to the difference in impurity concentration between the first and second body regions. Thus, the width of the effective JFET region in the entire length (depth) of the body region can be wider, compared to the case where the impurity concentration of the second body region is equal to the impurity concentration of the first body region. As a result, the saturation current of the semiconductor element can be increased.

In the semiconductor element, the second silicon carbide semiconductor layer of the first conductivity type may include a low-concentration layer in contact with the gate insulating film, and a high-concentration layer located under the low-concentration layer and having an impurity concentration higher than an impurity concentration of the low-concentration layer.

A semiconductor element of another embodiment of the present disclosure includes: a semiconductor substrate of a first conductivity type; a first silicon carbide semiconductor layer of the first conductivity type located on a principal surface of the semiconductor substrate; a body region of a second conductivity type located in the first silicon carbide semiconductor layer; an impurity region of the first conductivity type located in the body region; a second silicon carbide semiconductor layer of the first conductivity type which is located on the first silicon carbide semiconductor layer and is in contact with at least part of the body region and at least part of the impurity region; a gate insulating film on the second silicon carbide semiconductor layer; a gate electrode on the gate insulating film; a first ohmic electrode electrically connected to the impurity region; and a second ohmic electrode provided on a back surface of the semiconductor substrate, wherein the body region of the second conductivity type includes a first body region in contact with a surface of the first silicon carbide semiconductor layer, and a second body region in contact with a bottom surface of the body region of the second conductivity type, and an impurity concentration of the first body region is twice or more an impurity concentration of the second body region, and the second silicon carbide semiconductor layer of the first conductivity type has an impurity concentration distribution in a direction perpendicular to the semiconductor substrate, and includes a first region on a side in contact with the gate insulating film, a second region on a side in contact with the first body region, and a third region of which an impurity concentration is higher than impurity concentrations of the first region and the second region.

In the second silicon carbide semiconductor layer of the first conductivity type, the first region may be a first low-concentration layer in contact with the gate insulating film, the third region may be a high-concentration layer located under the low-concentration layer and having an impurity concentration higher than an impurity concentration of the first low-concentration layer, and the second region may be a second low-concentration layer located under the high-concentration layer and having an impurity concentration lower than the impurity concentration of the high-concentration layer.

The second silicon carbide semiconductor layer of the first conductivity type may be comprised of the first low-concentration layer, the high-concentration layer, and the second low-concentration layer.

The semiconductor element may include an implanted region of the first conductivity type located between at least two body regions adjacent to each other, wherein the implanted region may be deeper than the first body region.

With this configuration, the expansion of the depletion layer into the JFET region is restricted in the first body region, as well. Thus, the width of the effective JFET region in the entire length (depth) of the body region can be wider, and the saturation current of the semiconductor element can be further increased.

The implanted region may be deeper than the second body region.

Further, the implanted region may be shallower than the second body region.

At least part of the implanted region may overlap the first body region, when viewed from the direction perpendicular to the semiconductor substrate.

With this configuration, the JFET region is totally covered by the implanted region, which makes it possible to reliably reduce the expansion of the depletion layer, extending from the pn junction between the first body region and the JFET region, into the JFET region.

At least part of the implanted region may overlap the impurity region, when viewed from the direction perpendicular to the semiconductor substrate. With this configuration, the impurity region overlaps the entire channel region, and therefore, threshold design in the channel becomes easy.

The implanted region may include a first implanted region in contact with the impurity region and a second implanted region in contact with a bottom surface of the implanted region, and an impurity concentration of the first implanted region may be twice or more an impurity concentration of the second body region. With this configuration, it is possible to achieve both of the high-concentration body region and restriction of expansion of the depletion layer into the JFET region.

The implanted region may be formed in a continuous manner by controlling a dose amount and dose energy of ion implantation. With this configuration, process steps can be simplified.

Electric potentials applied to the second ohmic electrode and the gate electrode, relative to a potential of the first ohmic electrode, are Vds and Vgs, respectively, and a gate threshold voltage is Vth, in the case of Vgs≥Vth, a current may flow from the second ohmic electrode to the first ohmic electrode via the second silicon carbide semiconductor layer, and in the case of 0 V≤Vgs<Vth, with a decrease in Vds from 0 V, a current may flow from the first ohmic electrode to the second ohmic electrode via the second silicon carbide semiconductor layer before a current starts to flow from the body region to the first silicon carbide semiconductor layer.

In this configuration, the impurity concentration of a higher impurity concentration portion of the second silicon carbide semiconductor layer near the body region is controlled, for example, thereby allowing a current to flow during off time of the semiconductor element from the first ohmic electrode to the second ohmic electrode via the first silicon carbide semiconductor layer to be a channel layer, before conduction of a body diode comprised of the body region and the first silicon carbide semiconductor layer. Thus, the semiconductor element can function as a semiconductor element including a diode function in the channel portion. As a result, with an increase in saturation current, crystal deterioration of the SiC-FET due to conduction of the body diode, and element deterioration such as an increase in recovery loss, can be reduced, and further, it is possible to omit externally-provided freewheeling diode when the semiconductor element is applied to an inverter. It is therefore possible to reduce the number of parts of the inverter.

Further, according to the present embodiment, of the second silicon carbide semiconductor layer, the impurity concentration of a portion near the first body region is determined to obtain desired diode characteristics. Of the second silicon carbide semiconductor layer, the impurity concentration of a portion near the gate insulating film is determined to increase the saturation current of the semiconductor element. Further, of the body region, the impurity concentration of the first body region in contact with the second silicon carbide semiconductor layer is determined to obtain desired diode characteristics. Of the body region, the impurity concentration of the second body region not in contact with the second silicon carbide semiconductor layer is determined to increase the saturation current of the semiconductor element.

The semiconductor substrate, the first silicon carbide semiconductor layer, the body region, the impurity region, the second silicon carbide semiconductor layer, the gate insulating film, the gate electrode, the first ohmic electrode, and the second ohmic electrode form a metal-insulator-semiconductor field-effect transistor, an electric potential of the second ohmic electrode relative to a potential of the first ohmic electrode is Vds; an electric potential of the gate electrode relative to the potential of the first ohmic electrode is Vgs; a gate threshold voltage of the metal-insulator-semiconductor field-effect transistor is Vth; a direction of a current flowing from the second ohmic electrode to the first ohmic electrode is defined as a forward direction; and a direction of a current flowing from the first ohmic electrode to the second ohmic electrode is defined as a reverse direction, in the case of Vgs≥Vth, the metal-insulator-semiconductor field-effect transistor may allow conduction between the second ohmic electrode and the first ohmic electrode via the second silicon carbide semiconductor layer, in the case of 0 V≤Vgs<Vth, the metal-insulator-semiconductor field-effect transistor may not allow a current to flow in the forward direction, and in the case of Vds<0 V, the metal-insulator-semiconductor field-effect transistor may function as a diode allowing a current to flow in the reverse direction from the first ohmic electrode to the second ohmic electrode via the second silicon carbide semiconductor layer, and an absolute value of a turn-on voltage of the diode may be smaller than an absolute value of a turn-on voltage of a body diode comprised of the body region and the first silicon carbide semiconductor layer.

In the metal-insulator-semiconductor field-effect transistor, the on-state current of the transistor to which Vgs sufficient to turn the transistor on is applied and wherein Vds is 1 V, is defined as Id1. In the case of Vds<0 V, Vds necessary to allow a current of |Id1| to flow in the diode may be Vds>−2.5 V under a room temperature so that a current flows in the diode in a reverse direction with Vgs of 0 V.

In the case of Vds<0 V, Vds necessary to allow a current of |Id1| to flow in the diode may be Vds>−2.0 V so that a current flows in the diode in a reverse direction with Vgs of 0 V.

The current Id1 may be defined as a current which flows from the second ohmic electrode to the first ohmic electrode in the case of Vgs=tox×3×10$^6$ V and Vds=1 V, where tox (cm) is a thickness of the gate insulating film.

The impurity concentration of the first body region may be $1 \times 10^{18}$ cm$^{-3}$ or more and $1 \times 10^{20}$ cm$^{-3}$ or less, and the impurity concentration of the second body region may be $1 \times 10^{17}$ cm$^{-3}$ or more and $1 \times 10^{19}$ cm$^{-3}$ or less.

The first body region and the second body region may have thicknesses of 15 nm and 100 nm, respectively, in a direction perpendicular to the principal surface of the semiconductor substrate.

The first body region and the second body region may be continuously formed by controlling a dose amount and dose energy of ion implantation.

The second silicon carbide semiconductor layer may be electrically connected to the impurity region and a region of the first silicon carbide semiconductor layer which is adjacent to the first body region, and the second silicon carbide semiconductor layer may be provided on the first body region.

The second silicon carbide semiconductor layer may be formed by epitaxial growth.

The second silicon carbide semiconductor layer may have the impurity concentration distribution in a direction perpendicular to the semiconductor substrate by controlling an impurity gas during the epitaxial growth.

The second silicon carbide semiconductor layer may be a multilayered structure obtained by forming a high-concentration layer including an impurity gas, and after that, reducing the impurity gas and forming a low-concentration layer on the high-concentration layer.

The low-concentration layer may be an undoped layer which intentionally does not contain an impurity gas.

The impurity concentration of the low-concentration layer may be $1\times10^{17}$ cm$^{-3}$ or less.

The impurity concentration of the high-concentration layer may be $1\times10^{18}$ cm$^{-3}$ or more.

A semiconductor element of an embodiment of the present disclosure will be described in detail below. The semiconductor element described below includes a MISFET comprised of a channel layer functioning as a channel region and made of silicon carbide, a gate electrode which controls a current flowing in the channel layer, a silicon carbide semiconductor layer provided on a substrate, a source electrode electrically connected to the channel layer, and a drain electrode electrically connected to the substrate. The MISFET functions as a diode which allows a current to flow from the source electrode to the drain electrode via the channel layer in the case where an electric potential of the gate electrode, relative to a potential of the source electrode, is 0 or more and less than a threshold voltage Vth of the transistor.

In the specification of the present application, the electric potential of the drain electrode D relative to the potential of the source electrode S is Vds. The electric potential of the gate electrode G relative to the potential of the source electrode S is Vgs. The direction of current flowing from the drain electrode D to the source electrode S is defined as a "forward direction" and the direction of current flowing from the source electrode S to the drain electrode D is defined as a "reverse direction." The unit of electric potential and the unit of voltage are the volt (V).

(Embodiment)

An example semiconductor element of an embodiment of the present disclosure will be described with reference to the drawings.

FIG. 1 schematically shows a cross-sectional configuration of a semiconductor element 100 of the present embodiment. FIG. 1 shows a schematic cross section of two unit cells 100u, connected in parallel to each other, of a vertical MISFET using SiC. Commercially available semiconductor element 100 includes a plurality of unit cells 100u.

<Configuration of Semiconductor Element 100>

The semiconductor element 100 includes a semiconductor substrate 101 of a first conductivity type, and a first silicon carbide semiconductor layer (a silicon carbide epitaxial layer) 102 of the first conductivity type provided on the principal surface of the semiconductor substrate 101. In the present embodiment, the first conductivity type is n-type, and the second conductivity type is p-type. However, the first conductivity type may be p-type and the second conductivity type may be n-type. The semiconductor substrate 101 has n$^+$ conductivity, and made of silicon carbide (SiC). The first silicon carbide semiconductor layer 102 has n– conductivity. The superscript "+" or "–" following the letter "n" or "p" of n-type conductivity or p-type conductivity indicates relative concentrations of impurities. The "n$^+$" indicates that the n-type impurity concentration is higher than "n," and "n$^-$" indicates that the n-type impurity concentration is lower than "n." Further, the term "impurity concentration" which will be described below refers to, unless otherwise indicated, an average of the impurity concentration distributed in a depth direction of a target member which is observed by checking a cross section of the target member.

The first silicon carbide semiconductor layer 102 includes therein a body region 103 of the second conductivity type different from the first conductivity type of the semiconductor substrate 101. The remaining region of the first silicon carbide semiconductor layer 102, other than the body region 103, is called a drift region 102d.

The body region 103 includes a first body region 103a of the second conductivity type and a second body region 103b of the second conductivity type. The first body region 103a is in contact with a surface of the first silicon carbide semiconductor layer 102. The second body region 103b is in contact with a bottom surface 103u of the body region 103. The first body region 103a and the second body region 103b have thicknesses of at least 15 nm and 100 nm, respectively, in a direction perpendicular to the principal surface of the semiconductor substrate 101. In the present embodiment, the first body region 103a is of p$^+$ type, and the second body region 103b is of p-type. As will be described in detail below, the impurity concentration of the first body region 103a may be twice or more the impurity concentration of the second body region 103b.

The body region 103 is formed by introducing an impurity of the second conductivity type into the first silicon carbide semiconductor layer 102 of the first conductivity type. Thus, the body region 103 contains impurities of the first conductivity type and impurities of the second conductivity type, and is defined as a region whose impurity concentration of the second conductivity type is higher than the impurity concentration of the first conductivity type. At the bottom surface 103u of the body region 103, the impurity concentration of the first conductivity type of the drift region 102d (the first silicon carbide semiconductor layer 102) in contact with the body region 103, and the impurity concentration of the second conductivity type of the second body region 103b are equal to each other. Further, the outer periphery of the first body region 103a approximately coincides with the outer periphery of the second body region 103b, when viewed from the direction perpendicular to the principal surface of the semiconductor substrate 101.

An impurity region 104 of the first conductivity type is located in the body region 103. The impurity region 104 is of n$^+$ type.

A contact region 105 of the second conductivity type may be formed in the first body region 103a. The contact region 105 may be of p$^+$ type. The contact region 105 is in contact with the second body region 103b. A source electrode (a first ohmic electrode) 109 is provided on the impurity region 104. The source electrode 109 is formed in the surfaces of the impurity region 104 and the contact region 105, and is electrically connected to both of the impurity region 104 and the contact region 105. The contact region 105 does not have to be provided if the impurity concentration of the first body region 103a is high enough. In such a case, a contact trench is formed in the impurity region 104 to expose the first body region 103a, and the source electrode 109 is formed in the contact trench, thereby providing direct contact between the first body region 103a and the source electrode 109, or no impurity may be implanted in a portion corresponding to the contact region 105 when forming the impurity region 104, to expose the first body region 103a and provide direct contact between the first body region 103a and the source electrode 109.

Figure 2:
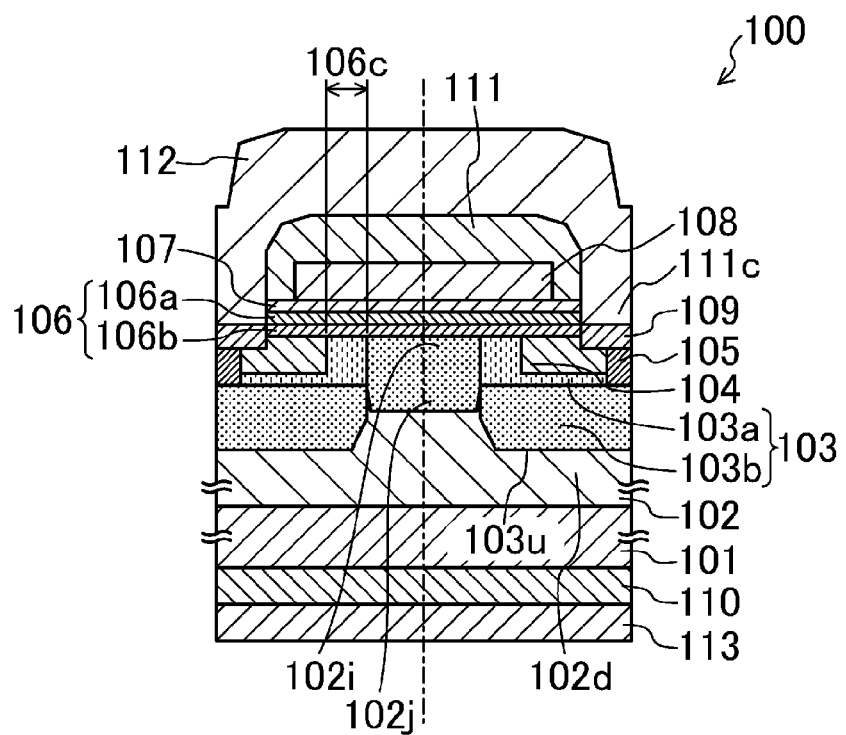
FIG. 2(a) is a cross section of a main part, showing a variation of the depth of an implanted region of the semiconductor element.
FIG. 2(b) is a schematic diagram showing an example arrangement of unit cells.
FIG. 2(c) is a schematic diagram showing another example arrangement of unit cells.
Figure 2:
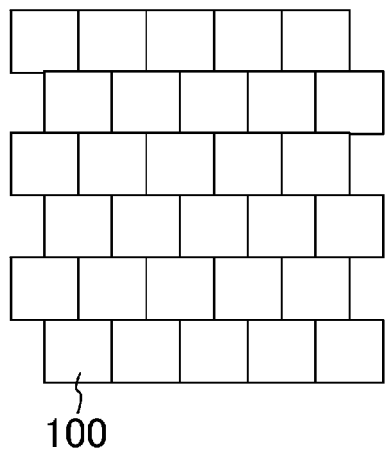
Figure 2:
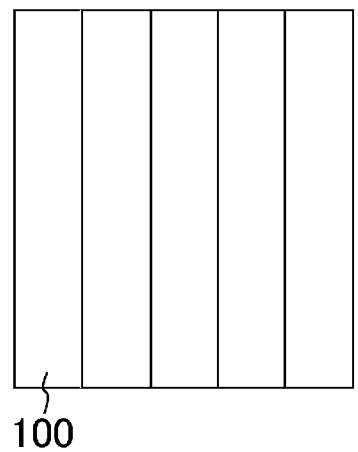
Figure 3:
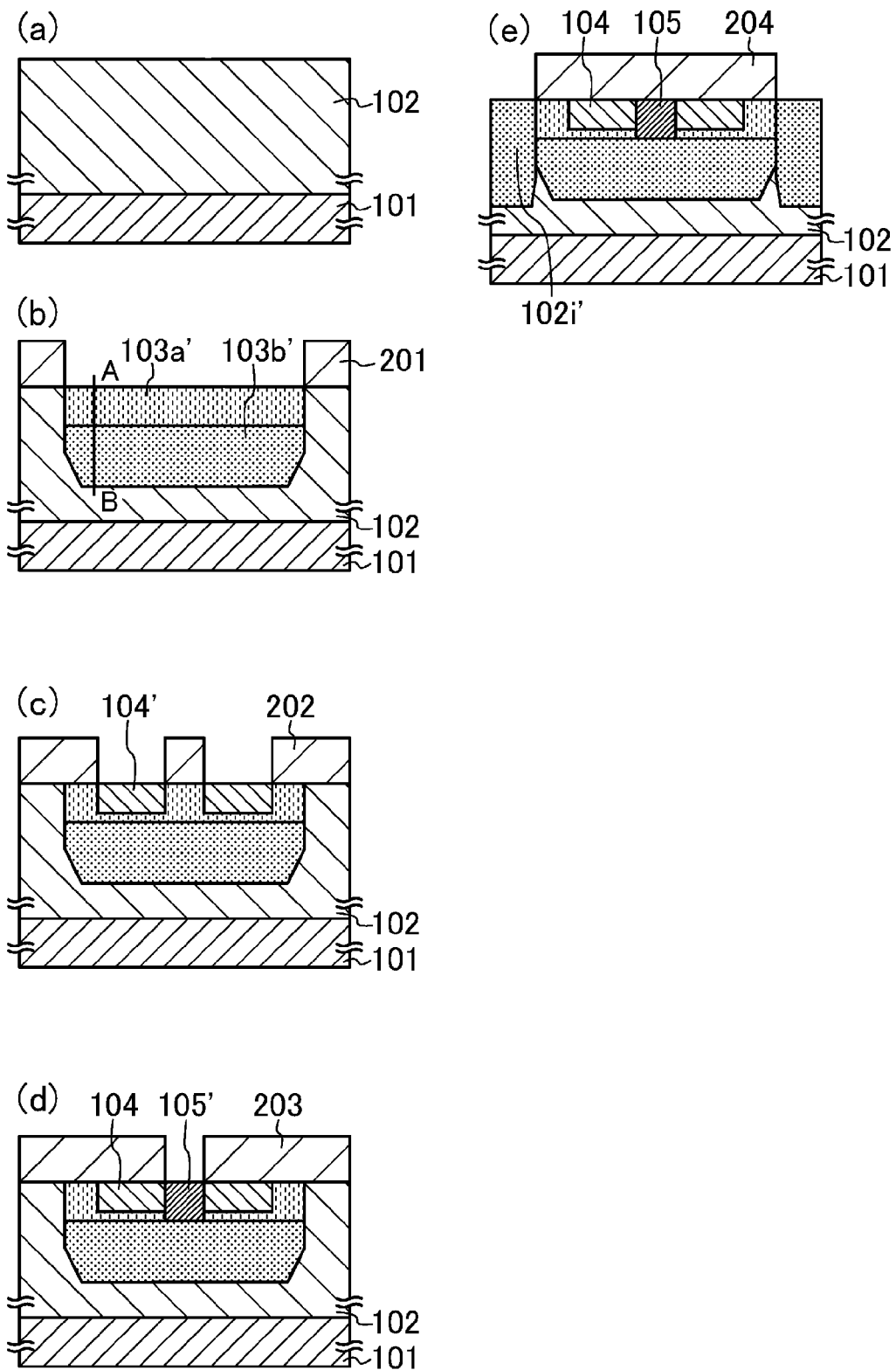
FIG. 3(a) shows a step of forming a first silicon carbide semiconductor layer of the semiconductor element.
FIG. 3(b) shows a step of forming a first body region and a second body region.
FIG. 3(c) shows a step of forming an impurity region.
FIG. 3(d) shows a step of forming a contact region.
FIG. 3(e) shows a step of forming an implanted region.
Figure 4:
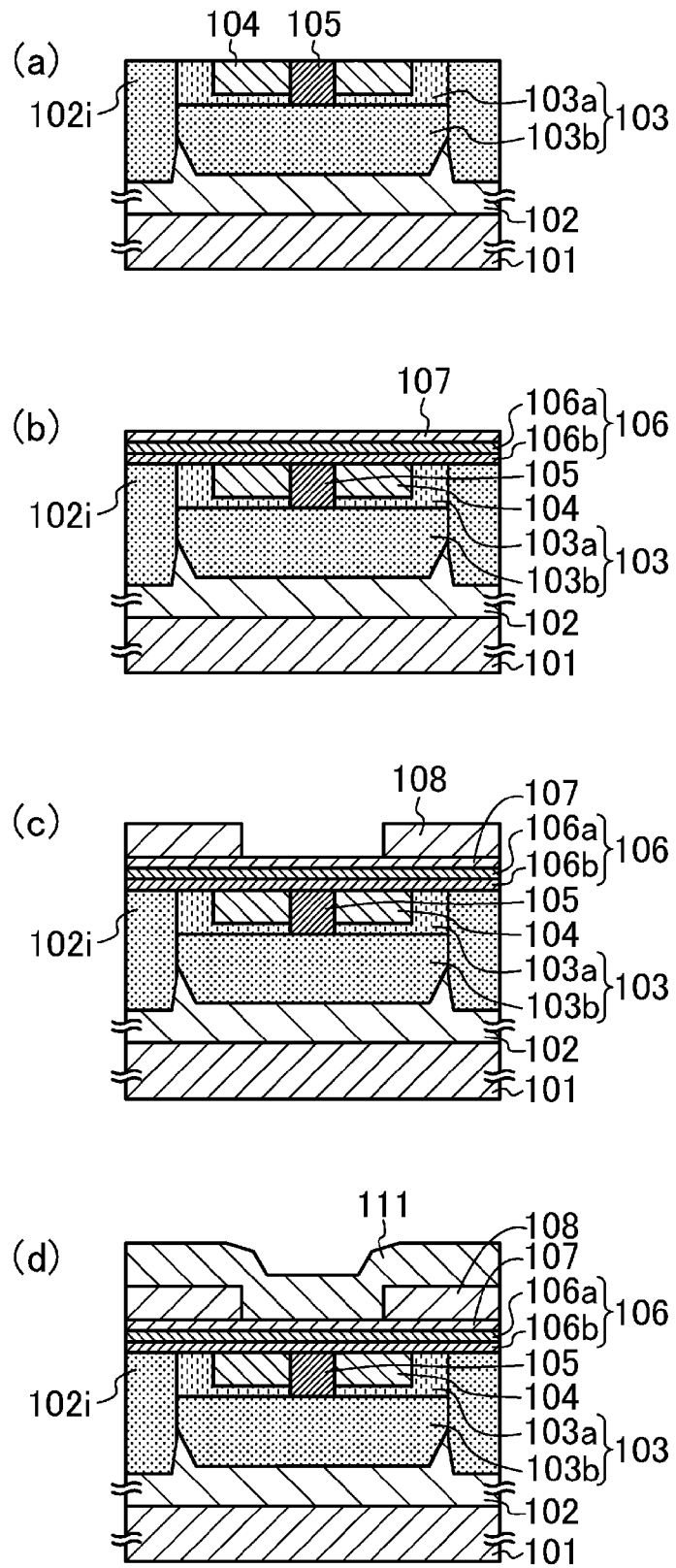
FIG. 4(a) shows a mask removal and activation annealing step of the semiconductor element.
FIG. 4(b) shows a step of forming a first silicon carbide semiconductor layer.
FIG. 4(c) shows a step of forming a gate electrode.
FIG. 4(d) shows a step of forming an interlayer insulating film.
Figure 5:
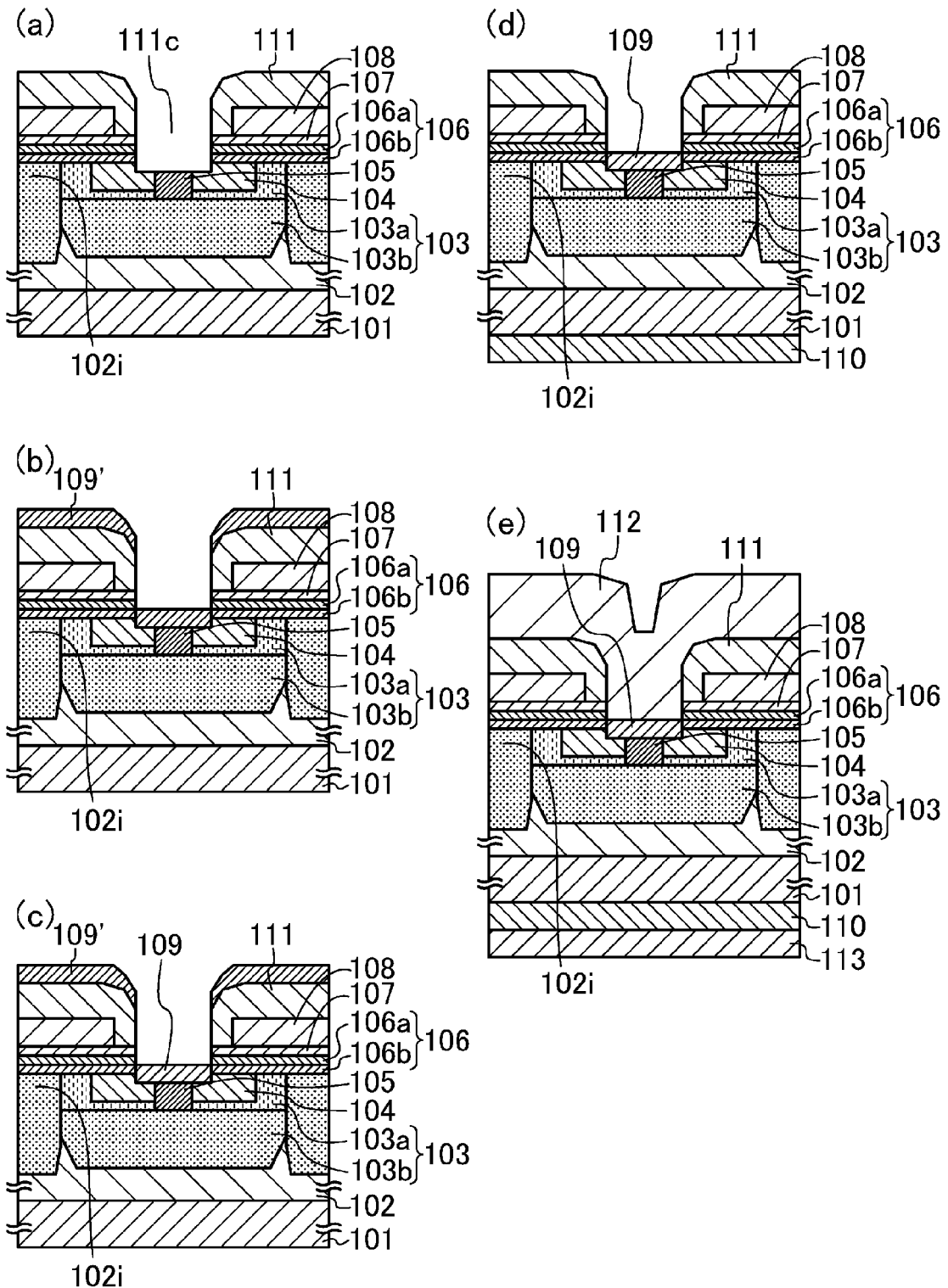
FIG. 5(a) shows a step of forming a contact hole of the semiconductor element.
FIG. 5(b) shows a step of forming a nickel film for forming a source electrode.
FIG. 5(c) shows a step of forming the source electrode.
FIG. 5(d) shows a step of forming a drain electrode.
FIG. 5(e) shows a step of forming an upper electrode and a back electrode.

Of the drift region 102d, a region adjacent to the body region 103, that is, a region between the body regions 103 of two adjacent unit cells, is called a junction field-effect transistor (JFET) region 102j for easier explanation. Since the JFET region 102j is made of the first silicon carbide semiconductor layer 102, the impurity concentration of the JFET region 102j may be equal to the impurity concentration of the first silicon carbide semiconductor layer 102, or as shown in FIG. 1 and FIG. 2(a), an implanted region 102i whose impurity concentration is higher than the impurity concentration of the first silicon carbide semiconductor layer 102 may be formed by introducing an impurity of the first conductivity type (n-type in this case) by ion implantation, for example. The implanted region 102i can reduce a resistance value of the JFET region 102j.

The depth of the implanted region 102i is set to be greater at least than the depth of the first body region 103a, as shown in FIG. 1 and FIG. 2(a). The depth of the implanted region 102i as mentioned herein is a depth of the implanted region 102i when the impurity concentration of the implanted region 102i is equal to the impurity concentration of the drift region 102d. The depth of the implanted region 102i is set to such a depth to increase an effective interval between two horizontally-adjacent first body regions 103a, that is, a width of a region which serves as a path of current flowing during on time of the semiconductor element 100, and to increase a saturation current of the semiconductor element 100. Details will be described later using FIG. 11. As shown in FIG. 1, the depth of the implanted region 102i may be deeper than the depth of the second body region 103b. In this case, the saturation current is increased and the resistance of the JFET region 102j is further reduced, thereby making it possible to reduce on resistance of the transistor. Further, as shown in FIG. 2(a), the depth of the implanted region 102i may be shallower than the depth of the second body region 103b, and deeper than the depth of the first body region 103a. In this case, the saturation current can be increased and it is possible to reduce a reduction in breakdown voltage of the transistor.

A second silicon carbide semiconductor layer 106 of the first conductivity type which is in contact with at least part of the body region 103 and at least part of the impurity region 104, is provided on the first silicon carbide semiconductor layer 102. The second silicon carbide semiconductor layer 106 may be electrically connected to the JFET region 102j adjacent to the first body region 103a, of the impurity region 104 and the first silicon carbide semiconductor layer 102, and may be provided on the first body region 103a.

In the present embodiment, the second silicon carbide semiconductor layer 106 is formed by epitaxial growth. The second silicon carbide semiconductor layer 106 is located in contact with the impurity region 104, the first body region 103a, and the JFET region 102j. In the examples shown in FIG. 1 and FIG. 2(a), the second silicon carbide semiconductor layer 106 is provided on the impurity region 104, the first body region 103a, and the JFET region 102j. The second silicon carbide semiconductor layer 106 includes a channel region 106c in a region contacting the first body region 103a. The length of the channel region 106c (channel length L) corresponds to the length indicated by the two bidirectional arrows shown in FIG. 1. That is, the channel length of the MISFET is defined by the size of the upper surface of the first body region 103a (a surface in contact with the second silicon carbide semiconductor layer 106) in a horizontal direction in the drawing. In the examples shown in FIG. 1 and FIG. 2(a), the outer periphery of the first body region 103a approximately coincides with the outer periphery of the second body region. Thus, the entire region where the body region 103 and the second silicon carbide semiconductor layer 106 are in contact with each other can be used as the channel length L.

The impurity concentration of the second silicon carbide semiconductor layer (a channel layer) 106 distributes in a direction perpendicular to the semiconductor substrate 101. Specifically, the distribution of the impurity concentration of the second silicon carbide semiconductor layer 106 is smaller on the side in contact with a gate insulating film 107 than on the side in contact with the first body region 103a.

For simple description, an example in which the second silicon carbide semiconductor layer 106 has a double-layered structure will be described below. One of the two layers of the second silicon carbide semiconductor layer 106 which is in contact with the body region 103 (the impurity region 104) is referred to as a lower layer 106b, and the other layer above the lower layer 106b is referred to as an upper layer 106a. The second silicon carbide semiconductor layer (the channel layer) 106 is formed by epitaxial growth. The impurity concentration of the second silicon carbide semiconductor layer 106 is controlled mainly by a flow rate of doping gas in the epitaxial growth. In this example, the doping gas is introduced to intentionally change the impurity concentration, thereby forming the upper layer 106a and the lower layer 106b. The lower layer 106b of the second silicon carbide semiconductor layer 106 contains an n-type impurity. The upper layer 106a of the second silicon carbide semiconductor layer 106 is, for example, in undoped state in which the impurity concentration is significantly low. The boundary between the upper layer 106a and the lower layer 106b is defined by a boundary where the impurity concentration is discontinuously changed, for example. A portion closer to the gate insulating film 107 from the boundary is the upper layer 106a. A portion closer to the body region 103 from the boundary is the lower layer 106b. A boundary where the impurity concentration decreases in a direction from the lower layer 106b to the upper layer 106a is selected. When such a boundary is selected, the impurity concentration of the upper layer 106a is lower than the impurity concentration of the lower layer 106b. Thus, the upper layer 106a is a low-concentration layer, and the lower layer 106b is a high-concentration layer. In the case where the impurity concentration continuously changes in the second silicon carbide semiconductor layer (a channel layer) 106, a portion with an arbitrary depth (e.g., 10 nm) from the surface closer to the gate insulating film 107 is defined as the upper layer 106a, and the other portion is defined as the lower layer 106b. In this case, as well, the impurity concentration of the upper layer 106a is lower than the impurity concentration of the lower layer 106b.

The gate insulating film 107 is provided on the second silicon carbide semiconductor layer 106. A gate electrode 108 is provided on the gate insulating film 107. The gate electrode 108 is located at least above the channel region 106c.

An interlayer insulating film 111 is provided so as to cover the gate electrode 108. An upper electrode 112 is provided on the interlayer insulating film 111. The upper electrode 112 is connected to the source electrode 109 through a contact hole 111c formed in the interlayer insulating film 111. A drain electrode (a second ohmic electrode) 110 is provided on the back surface of the semiconductor substrate 101. A back electrode 113 is further provided on the drain electrode 110.

The unit cell 100u of the semiconductor element 100 is in a square shape, for example, when the semiconductor element 100 is viewed from the upper electrode 112 side. The unit cell 100u may be in a rectangular shape, or may be in a polygonal shape other than a quadrilateral. FIG. 2(b) shows arrangement of the unit cells 100u. As shown in FIG. 2(b), the unit cells 100u are two-dimensionally arranged along x and y directions, for example, and the arrangement in the y direction is alternately shifted by half a unit cell 100u. In the case where the unit cell 100u has an elongated shape in one direction, the unit cells 100u may be arranged in parallel as shown in FIG. 2(c). The semiconductor device is comprised of the plurality of unit cells 100u arranged in these manners.

<Operation and Advantages of Semiconductor Element 100>

Now, operation of the semiconductor element 100 will be described. In the semiconductor element 100, a MISFET is configured by the second silicon carbide semiconductor layer 106, the gate electrode 108 which controls current flowing in the second silicon carbide semiconductor layer 106, the gate insulating film 107, the source electrode 109 electrically connected to the second silicon carbide semiconductor layer 106, and the drain electrode 110 electrically connected to the semiconductor substrate 101. The MISFET is in the on state in the case of Vgs≥Vth, where Vth is a threshold voltage of the MISFET (a threshold voltage of a forward current), and in the case of Vds>0 V, a current flows from the drain electrode 110 to the source electrode 109 via the semiconductor substrate 101, the drift region 102d, the JFET region 102j, the second silicon carbide semiconductor layer (a channel layer) 106 and the source region 104. On the other hand, the transistor is in the off state in the case of Vgs<Vth.

However, even in the off state, the MISFET of the present embodiment functions as a diode which allows a current to flow from the source electrode 109 to the drain electrode 110 via the second silicon carbide semiconductor layer 106 in the case of 0 V≤Vgs<Vth and Vds<0 V, by appropriately selecting the impurity concentration of the first body region 103a, the impurity concentrations of the upper layer 106a and the lower layer 106b of the second silicon carbide semiconductor layer 106, and the thicknesses of the upper layer 106a and the lower layer 106b of the second silicon carbide semiconductor layer 106. Hereinafter, in the specification of the present application, a diode which allows a current to flow from the source electrode 109 to the drain electrode 110 via the second silicon carbide semiconductor layer 106 is called a "channel diode." The direction from the drain electrode 110 to the source electrode 109 is referred to as a "forward direction" and the direction from the source electrode 109 to the drain electrode 110 is referred to as a "reverse direction." Therefore, the direction in which the diode allows the current to flow is a "reverse direction."

Characteristics of the channel diode in which the channel region of the MISFET serves as a current path are that it does not allow a current of 1 mA or more to flow in the case of Vds>Vf0 (Vf0 is a negative value), and allows a current of 1 mA or more to flow in the case of Vds≤Vf0. In other words, the current flowing in this diode is almost zero (less than 1 mA) in the case of Vds>Vf0 (Vf0 is a negative value), but as Vds is gradually reduced from zero (as the absolute value of Vds is increased), the current reaches 1 mA when Vds reaches Vf0. As the absolute value of Vds is further increased, the current increases. Thus, Vf0 corresponds to a turn-on voltage in the diode's current-voltage characteristics.

Both of the turn-on voltage Vf0 of the diode and the threshold voltage Vth of the transistor are decided mainly by the impurity concentration of the first body region 103a, the impurity concentration and the thickness of the second silicon carbide semiconductor layer 106 (the upper layer 106a and the lower layer 106b), and the thickness of the gate insulating film 107.

In the semiconductor element 100 of the present embodiment, it is possible to set the absolute value of the turn-on voltage Vf0 in the diode's current-voltage characteristics smaller than the absolute value of the voltage Vf (a turn-on voltage due to the pn junction, that is, 2.5 V or so in a room temperature) at which a current starts to flow in the body diode that is comprised of the drift region 102d and the body region 103, by increasing both of the impurity concentration of the surface of the body region 103 (i.e., the first body region 103a) and the impurity concentration of the lower layer 106b of the second silicon carbide semiconductor layer. Accordingly, in the semiconductor element 100, it is possible to allow a current to flow in the channel diode before a current starts to flow in the body diode, when the MISFET is in the off state and in the case of 0 V≤Vgs<Vth and Vds<0 V. The semiconductor element 100 may be an element which satisfies the above conditions and enables the current to flow in the channel diode further in the case of Vgs>0 and Vds<0 V.

Accordingly, in the semiconductor element 100 of the present embodiment, the channel diode of the semiconductor element 100 can serve as a so-called freewheeling diode, which is connected in antiparallel with the MISFET mounted on a commonly-used inverter circuit. This means that the semiconductor element 100 contains a freewheeling diode therein.

In the semiconductor element 100 of the present embodiment, the body region 103 is divided into the first body region 103a and the second body region 103b. Therefore, the impurity concentration of the regions 103a and 103b can be controlled independently of each other. That is, the turn-on voltage Vf0 of the diode can be controlled by adjusting the impurity concentration of the first body region 103a on one hand, and the breakdown voltage of the semiconductor element 100 can be controlled by adjusting the impurity concentration of the second body region 103b on the other hand. For example, the impurity concentration of the first body region 103a is set to $1 \times 10^{18}$ cm$^{-3}$ or more and $1 \times 10^{20}$ cm$^{-3}$ or less, and the impurity concentration of the second body region 103b is set to $1 \times 10^{17}$ cm$^{-3}$ or more and $1 \times 10^{19}$ cm$^{-3}$ or less. The impurity concentration of the first body region 103a may be twice or more the impurity concentration of the second body region 103b.

In the semiconductor element 100, the second silicon carbide semiconductor layer 106 is provided on the impurity region 104 and JFET region 102j. In other words, the second silicon carbide semiconductor layer 106 is in contact with the upper surface of the drift layer 102. Thus, the amount of current flowing in the channel diode when the drain electrode 110 is negative (the reverse direction) relative to the source electrode 109 compares favorably with the amount of on-state current of the transistor when the drain electrode 110 is positive (the forward direction) relative to the source electrode 109. For this reason, even when the drain electrode 110 is negative (the reverse direction) relative to the source electrode 109, the current flowing in the body diode formed between the second body region 103b and the drift region 102d can be significantly reduced or reduced to zero. Therefore, much current can flow in the channel diode.

Further, in the semiconductor element 100 of the present embodiment, the second silicon carbide layer (the channel layer) 106 is comprised of the upper layer 106a and the lower layer 106b, in which the upper layer is an undoped layer and the lower layer is a highly-doped layer. The undoped layer may contain no impurity at all. Further, the impurity concentration of the upper layer 106a may be half or less of the impurity concentration of the lower layer 106b, or may be one tenth or less.

Further, the semiconductor element 100 of the present embodiment includes the implanted region 102i of the first conductivity type (n-type in this embodiment). The implanted region 102i may be formed from the surface of the first silicon carbide semiconductor layer 102 in a direction perpendicular to the semiconductor substrate 101 to have a depth deeper than the depth of the first body region 103a. The impurity concentration of the implanted region 102i is higher than the impurity concentration of the drift region 102d, and may be at least twice, or ten times or more the impurity concentration of the drift region 102d.

In the semiconductor element 100 of the present embodiment, the channel layer 106 has a multilayered structure, and the body region 103 also has a multilayered structure, different from conventional semiconductor elements. Adopting this structure enables much current to flow in the channel diode, and much saturation current of the transistor to flow, compared to the conventional semiconductor elements.

Further, the absolute value of the turn-on voltage Vf0 of the channel diode can be smaller than the absolute value of the turn-on voltage of the body diode. Therefore, power loss can be reduced in the case where the semiconductor element is mounted on an inverter circuit. Further, since the current flowing in the body diode can be significantly reduced or reduced to zero, crystal deterioration of the semiconductor element 100 can be reduced, thereby making it possible to provide a highly-reliable semiconductor element capable of allowing a large current to flow.

<Method for Forming Semiconductor Element 100>

Now, an example method for forming the semiconductor element 100 of the present embodiment will be described in detail with reference to FIG. 3 to FIG. 6. The specific values, materials, and process conditions which will be described below are merely examples.

First, a semiconductor substrate 101 is prepared. The semiconductor substrate 101 is an n-type 4H—SiC off-cut substrate of a low resistance (a resistivity of 0.02 Ωcm), for example.

As shown in FIG. 3(a), a first silicon carbide semiconductor layer 102 of a high resistance is epitaxially grown on the semiconductor substrate 101. A buffer layer made of SiC with high impurity concentration may be formed on the semiconductor substrate 101 before forming the first silicon carbide semiconductor layer 102. The impurity concentration of the buffer layer is $1 \times 10^{18}$ cm$^{-3}$, for example, and the thickness of the buffer layer is 1 μm. The first silicon carbide semiconductor layer 102 is made of n-type 4H—SiC, for example, and the impurity concentration and the thickness are $1 \times 10^{16}$ cm$^{-3}$ and 10 μm, respectively, for example.

Next, as shown in FIG. 3(b), a mask 201 made of SiO$_2$, for example, is formed on the first silicon carbide semiconductor layer 102, and aluminum (Al) ions, for example, are implanted in the first silicon carbide semiconductor layer 102. The ion implanted region formed at this moment includes a first body implanted region 103a' formed in a shallow region and having high concentration, and a second body implanted region 103b' formed in a region deeper than the first body implanted region 103a' and having concentration lower than the concentration of the first body implanted region 103a'.

The first body implanted region 103a' and the second body implanted region 103b' will be a first body region 103a and a second body region 103b, respectively, after the implanted ions are activated. Further, the remaining region of the first silicon carbide semiconductor layer 102, other than the first body region 103a second body region 103b, will be a drift region 102d.

Figure 6:
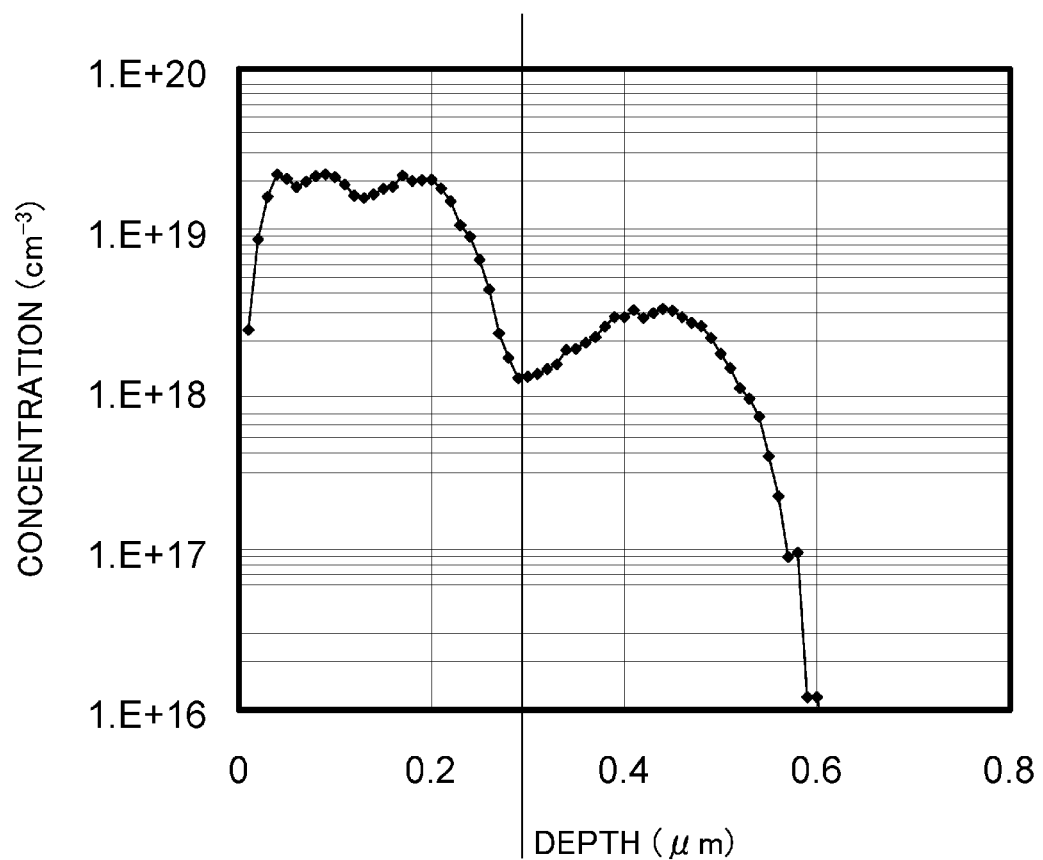
FIG. 6 is an example profile of the body region of the semiconductor element.

An example profile of the ion implantation in the A-B cross section of FIG. 3(b) is shown in FIG. 6.

In the case where Al is selected as an implantation ion as in the present embodiment, changes in concentration profile due to the diffusion is almost negligible because a diffusion coefficient of Al in silicon carbide is small. In comparison, when boron is used as an impurity of the body region 103, an activation rate and a diffusion coefficient are checked beforehand, and energy and an amount of ion implantation are selected to obtain a desired profile of the impurity concentration. The ion implantation profile in the A-B cross section is determined such that both of the impurity concentration of the first body region 103a and the impurity concentration of the second body region 103b in FIG. 5(e), described later, will be desired values in the end.

The first body region 103a and the second body region 103b are formed by ion implantation, and therefore have a peak and a tail. The term "peak" refers to a maximum value of the concentration in an ion implantation range Rp, and the term "tail" refers to a portion in which the concentration is gradually reduced in a deeper direction from the maximum value. For example, the ion implantation profile shown in FIG. 6 can be obtained by implanting Al ions with the following implantation energy and dose amount:

30 keV: $5.0 \times 10^{13}$ cm$^{-2}$
70 keV: $1.2 \times 10^{14}$ cm$^{-2}$
150 keV: $2.5 \times 10^{14}$ cm$^{-2}$
350 keV: $6.0 \times 10^{13}$ cm$^{-2}$ In this case, as shown in solid line in FIG. 6, a portion shallower than a depth 0.3 μm and a portion deeper than that are the first body implanted region 103a' and the second body implanted region 103b', respectively. The first body implanted region 103a' and the second body implanted region 103b' will be the first body region 103a and the second body region 103b, respectively, after activation of the impurity. As mentioned above, if the activation rate is 100%, the maximum impurity concentrations of the first body implanted region 103a' and the second body implanted region 103b' are about $2 \times 10^{19}$ cm$^{-3}$ and about $3 \times 10^{18}$ cm$^{-3}$, respectively. If the activation rate is 100%, these values are the maximum impurity concentrations of the first body region 103a and the second body region 103b. The impurity concentrations of the first body region 103a and the second body region 103b are about $1.6 \times 10^{19}$ cm$^{-3}$ and about $2.0 \times 10^{18}$ cm$^{-3}$, respectively.

The impurity concentration of the first body region 103a is an average of a region where the impurity concentration is $2 \times 10^{18}$ cm$^{-3}$ or more. The impurity concentration of the second body region 103b is an average of a region where the impurity concentration is $5 \times 10^{17}$ cm$^{-3}$ or more. In the present embodiment, the impurity concentrations are defined as $2 \times 10^{18}$ cm$^{-3}$ or more and $5 \times 10^{17}$ cm$^{-3}$ or more for clarity, but these values may be changed according to designs of the semiconductor element. The reference values of $2 \times 10^{18}$ cm$^{-3}$ or more and $5 \times 10^{17}$ cm$^{-3}$ or more in the present embodiment are based on an impurity concentration S near the boundary between the first body region 103a and the second body region 103b. Specifically, the impurity concentration S is defined as $S=1 \times 10^{18}$ cm$^{-3}$, and the regions from which the impurity concentrations is calculated are a region where the impurity concentration S is S×2 or more and S/2 or more.

The impurity concentrations are calculated in the following manner, for example. That is, a relationship between the depth direction and the impurity concentration in a certain cross section is clarified by secondary ion mass spectrometry (SIMS), for example, as shown in FIG. 6, and then, a region in the depth direction is defined. As to the first body region 103a of the present specification, the impurity concentration is defined as an average of a region where the impurity concentration is $2 \times 10^{18}$ cm$^{-3}$ or more; therefore, the depth is 0.28 μm. The impurity concentrations are integrated in the depth direction, and converted into a sheet dose amount (the dimension of unit is cm$^{-2}$). The sheet dose amount calculated at this time is divided by the depth of the region (i.e., 0.28 μm in this example), thereby obtaining the impurity concentration.

The following description will be given based on FIG. 6 showing the impurity concentration profile of the first body region 103a and the second body region 103b. As shown in FIG. 6, each of the thicknesses (the depths) of the first body region 103a and the second body region 103b is 300 nm in the direction perpendicular to the principal surface of the semiconductor substrate 101, that is, the thickness direction of the first silicon carbide semiconductor layer 102. The impurity concentration of the first body region 103a may be twice or more, and one hundred times or less the impurity concentration of the second body region 103b.

The thickness (the depth) of the first body region 103a is determined according to the turn-on voltage Vf0 of the channel diode, the impurity concentration and the thickness of the second silicon carbide semiconductor layer 106, and the thickness of the gate insulating film, as well as according to the behavior of the saturation current during on state when the semiconductor element 100 functions as a MISFET. In the case where the semiconductor element 100 functions as a channel diode, a depletion layer, which expands from an interface between the second silicon carbide semiconductor layer 106 and the first body region 103a toward the first body region 103a, only has to be within the first body region 103a, with 0 V applied to the gate electrode 108. To achieve this, the thickness of the first body region 103a may be 15 nm or more, within a range of application of the present embodiment. Further, the thickness of the second body region 103b may be 100 nm or more. In the case where the semiconductor element 100 has a desired breakdown voltage, the impurity concentration and the thickness of the second body region 103b may be decided such that no punch through will occur between the impurity region (the source region) 104 and the drift region 102d.

As shown in FIG. 3(c), the mask 201 is removed after the ion implantation, and nitrogen ions, for example, are subsequently implanted in the body implanted region 103a', using a mask 202, to form an impurity implanted region 104'. The mask 202 may be formed by maintaining the mask 201 and forming a sidewall mask on the mask 201 (that is, a so-called self-aligned process may be applied in which the impurity implanted region 104' is formed in the body implanted region 103a' in a self-aligned manner).

After the ion implantation, the mask 202 is removed, and as shown in FIG. 3(d), Al is implanted after a mask 203 is formed, thereby forming a contact implanted region 105'. The contact implanted region 105' may reach the second body implanted region 103b'.

Next, the mask 203 is removed, and an implanted region 102i' of the first conductivity type shown in FIG. 3(e) is formed such that the implanted region 102i' includes all of a JFET region 102j when viewed from above the semiconductor substrate 101. The implanted region 102i' is formed by implanting N ions, for example. The implanted region 102i' is formed from the surface of the first silicon carbide semiconductor layer 102 in a direction perpendicular to the semiconductor substrate 101 to have a depth deeper than at least the depth of the first body implanted region 103a'. In the present embodiment, the implanted region 102i' has a depth deeper than the depth of the second body implanted region 103b'. The impurity concentration of the ion implantation of the implanted region 102i' is higher than the impurity concentration of the drift region 102d. In the present embodiment, the impurity concentration of the implanted region 102i' is set to about $1\times10^{17}$ cm$^{-3}$.

After implantation of these ions, the mask 204 is removed and a high-temperature heat treatment (activation annealing) for activating the impurities implanted in the first silicon carbide semiconductor layer 102 is performed, thereby forming the first body region 103a, the second body region 103b, the impurity region 104, the contact region 105, and the implanted region 102i, as shown in FIG. 4(a). The ion implantation profile is determined such that the depth of the first body region 103a will be 300 nm, for example, and such that the impurity concentration will be about $1.6\times10^{19}$ cm$^{-3}$ by applying the above-mentioned definitions. However, the impurity concentration of the first body region 103a near the surface of the first silicon carbide semiconductor layer 102 is about $2\times10^{19}$ cm$^{-3}$. The ion implantation profile is adjusted such that the total depth of the body region 103 including the depths of the first body region 103a and the second body region 103b is 550 nm, for example, and such that the impurity concentration of the second body region 103b is about $2\times10^{18}$ cm$^{-3}$. The ion implantation profile is adjusted such that the depth of the impurity region 104 is 250 nm, for example, and such that the impurity concentration is about $5\times10^{19}$ cm$^{-3}$. The depth of the first body region 103a is determined by the boundary shown in FIG. 6. The depth of the second body region 103b is a depth which makes the impurity concentration to be $5\times10^{17}$ cm$^{-3}$, for example. The depth of the impurity region 104 is a depth which makes the impurity concentration to be $5\times10^{17}$ cm$^{-3}$. The depth of the implanted region 102i is a depth according to which the impurity concentration of the first silicon carbide semiconductor layer 102 is $1\times10^{16}$ cm$^{-3}$, for example.

The depth of the contact region 105 is 400 nm, for example, and the impurity concentration is about $1\times10^{20}$ cm$^{-3}$. The depth is a depth which makes the impurity concentration to be $5\times10^{17}$ cm$^{-3}$. A surface layer of the first silicon carbide semiconductor layer 102' may be removed for surface cleaning of the first silicon carbide semiconductor layer 102 after the activation annealing. For example, in the case where a thickness of 50 nm of the surface layer of the first silicon carbide semiconductor layer 102' is removed, the thicknesses of the first body region 103a, the second body region 103b, the impurity region 104, and the contact region 105 are reduced by 50 nm for each, and will be 250 nm, 200 nm, 200 nm, and 350 nm, respectively.

Next, as shown in FIG. 4(b), a second silicon carbide semiconductor layer 106 is epitaxially grown on the entire surface of the drift layer 102 including the implanted region 102i, the first body region 103a, the impurity region 104, and the contact region 105. The second silicon carbide semiconductor layer 106 is comprised of the upper layer 106a and the lower layer 106b, as mentioned above. In the present embodiment, the upper layer 106a is formed subsequently after the lower layer 106b is formed. The epitaxial growth may be stopped after forming the lower layer 106b of the second silicon carbide semiconductor layer 106, and after some time, epitaxial growth may be additionally performed to form the upper layer 106a. The impurity concentration and the thickness of the lower layer 106b are about $2\times10^{18}$ cm$^{-3}$ and 24 nm, respectively. The lower layer 106b is formed by doping of nitrogen. The doping gas is stopped after the formation of the lower layer 106b to create an undoped state and thereby the upper layer 106a is subsequently formed. Since the upper layer 106a is undoped, the impurity concentration is ideally $1\times10^{15}$ cm$^{-3}$ or less, but may sometimes be $5\times10^{16}$ cm$^{-3}$ or less due to effects of residual nitrogen, etc., during the epitaxial growth. The upper layer 106a is controlled such that the thickness thereof will be about 26 nm in the end. However, the thickness of the upper layer 106a is set to be greater than the desired value (e.g., 26 nm) because part of the upper layer 106a is lost due to oxidation in a subsequent gate insulating film formation step. The thickness of the upper layer 106a is set to be the desired value of 26 nm if an insulating film as a gate insulating film 107 is formed without using a thermal oxidation step.

Next, a predetermined portion of the second silicon carbide semiconductor layer 106 (i.e., a layered structure of the upper layer 106a and the lower layer 106b) is dry etched. After that, a gate insulating film 107 is formed on the surface of the upper layer 106a of the second silicon carbide semiconductor layer by thermal oxidation, for example. In the case where the gate insulating film 107 is formed by thermal oxidation, the thickness of the upper layer 106a of the second silicon carbide semiconductor layer 106 is adjusted such that its thickness after the formation of the gate insulating film 107 will have a desired value (e.g., 26 nm), considering the thickness to be reduced due to the thermal oxidation, because part of the upper layer 106a of the second silicon carbide semiconductor layer will become the gate insulating film 107 as described above. In this example, the thickness of the upper layer 106a of the second silicon carbide semiconductor layer is increased by about 50 nm from the desired value, and the thickness of the desired value is achieved after the upper layer 106a of the second silicon carbide semiconductor layer goes through a step of cleaning the upper layer 106a before formation of the gate insulating film 107, and a step of forming the gate insulating film 107. After that, a polycrystal silicon film doped with phosphorus in a concentration of about $7 \times 10^{20}$ cm$^{-3}$ is formed on the surface of the gate insulating film 107. The thickness of the polycrystal silicon film is about 500 nm, for example.

Next, as shown in FIG. 4(c), the polycrystal silicon film is dry etched using a mask (not shown), thereby forming a gate electrode 108 in a desired region.

Next, as shown in FIG. 4(d), an interlayer insulating film 111 made of $SiO_2$, for example, is formed by chemical vapor deposition (CVD) to cover the surface of the gate electrode 108 and the surface of the first silicon carbide semiconductor layer 102. The thickness of the interlayer insulating film 111 is 1 μm, for example.

Next, as shown in FIG. 5(a), a contact hole 111c is formed by removing the interlayer insulating film 111 on the surface of the contact region 105 and on part of the surface of the impurity region 104 by dry etching using a mask (not shown).

Next, as shown in FIG. 5(b), a nickel film 109' having a thickness of about 50 nm, for example, is formed on the interlayer insulating film 111. As shown in FIG. 5(c), the nickel film 109' is made to react with the silicon carbide surface by being subjected to a heat treatment in an inert atmosphere at a temperature of 950° C. for five minutes, thereby forming a source electrode 109 made of nickel silicide.

Next, as shown in FIG. 5(d), the nickel film 109' on the interlayer insulating film 111 is removed by etching. After that, nickel, for example, is deposited on the entire back surface of the semiconductor substrate 101, and the nickel is made to react with silicon carbide in a similar manner, thereby forming a drain electrode 110.

Next, as shown in FIG. 5(e), an aluminum film having a thickness of about 4 μm is formed on the interlayer insulating film 111 and in the contact hole 111c, and the aluminum film is etched in a desired pattern, thereby forming an upper electrode 112. Although not shown, a gate wiring (or a gate pad) coming in contact with the gate electrode at a chip edge is also formed in another region. Further, as a back electrode 113 for die bonding, Ti/Ni/Ag (Ti is in contact with the drain electrode 110) are deposited on the back surface of the drain electrode 110. The semiconductor element 100 shown in FIG. 1 is obtained in this manner.

<Advantages>

The semiconductor element 100 of the present embodiment includes the first body region 103a and the second body region 103b having different impurity concentrations, and the channel layer 106 having a multilayered structure including the upper layer 106a and the lower layer 106b. It is therefore possible to keep the threshold voltage Vth of the transistor at a positive value, and also maintain a large saturation current of the transistor while reducing the turn-on voltage Vf0 of the channel diode to 1 V or less, for example. Accordingly, the channel diode can be used as a freewheeling diode, and it is possible to provide a reliable semiconductor element capable of allowing a large current to flow.

In order to increase the saturation current of the transistor while the turn-on voltage |Vf0| of the channel diode is reduced (e.g., the turn-on voltage |Vf0| may be reduced to 1 V or less, or may be further reduced to 0.6 V or less) and the threshold voltage Vth of the transistor is kept at a positive value (e.g., 2 V or more and 8 V or less), the impurity concentration of the second body region may be set to be lower than the impurity concentration of the first body region 103a. If the channel diode is designed to have a turn-on voltage of 1 V or less, the channel diode can substitute as a SiC Schottky diode that is a potential freewheeling diode, and if the channel diode is designed to have a turn-on voltage of 0.6 V or less, the channel diode can substitute as Si fast recovery diode. This means that the semiconductor element 100 can also include a function of a freewheeling diode without using these freewheeling diodes. Further, the threshold voltage Vth of a forward current may be 2 V or more. Semiconductor elements (MISFETs) commonly used for an inverter circuit, which is a power circuit, can be normally off (Vth>0 V) because they can cut off drain current and is therefore safe even when a gate control circuit breaks down by some cause and the gate voltage becomes 0 V. The threshold voltage of a MISFET decreases when the temperature of the MISFET becomes high. For example, in the case of a SiC-MOSFET, the threshold voltage may decrease by about 1 V by an increase in temperature by 100° C. If a noise margin for preventing the gate from being turned on by noise is 1 V, the threshold voltage Vth at a room temperature may be set to 2 V (i.e., 1 V+1 V) or more. If the threshold voltage is too high, the gate voltage in turning on the transistor is accordingly increased, and a power supply that generates the gate voltage is subject to many constraints. From a practical viewpoint, the threshold voltage may be 8 V or less at a room temperature.

Further, since the first silicon carbide semiconductor layer (the channel layer) 106 has a multilayered structure in which the impurity concentration of a portion closer to the gate insulating film 107 is lower than the impurity concentration of the other portion, the saturation current of the transistor can be kept large. In the semiconductor element 100 of the present embodiment, when the transistor is in the on state, a current flows in a path which connects the first silicon carbide semiconductor layer 102 and the JFET region 102j in series. In order to maintain a large saturation current of the transistor while maintaining the diode characteristics of the semiconductor element, designs of the channel layer and the JFET region, which significantly affect the current saturation characteristics of the transistor, are important. Findings by the present inventors obtained through their intensive studies will be described below with reference to electrical characteristics.

A saturation current of a transistor will be described now. In general, the following relationship exists between "Idsat1" as a saturation current of a transistor, "μch" as mobility of a channel portion, "Wch" as a channel width, "Co" as a gate insulating film capacity, and "Lg" as a channel length:

$$Idsat1 \propto \mu ch \times Wch \times Co/Lg \qquad (1)$$

If the structure near the JFET region 102j in the semiconductor element 100 is considered as a junction transistor, the saturation current Idsat2 of the JFET region 102j has the following relationship:

$$Idsat2 \propto \mu j \times a \times Nj \times W/Lp \qquad (2)$$

wherein "μj" is mobility in the JFET region 102*j*; "a" is an interval between adjacent two body regions 103; "Nj" is an impurity concentration of the JFET region 102*j*; "W" is a length of a boundary line of the body region 103 on the surface of the first silicon carbide semiconductor layer 102, the boundary line corresponding to the channel width of the JFET region 102*j*; and "Lp" is a depth of the body region 103 from the surface of the first silicon carbide semiconductor layer 102. The saturation current Idsat of the semiconductor element 100 as a transistor is affected by both of the saturation currents Idsat1 and Idsat2 which are in series. Thus, to increase the saturation current Idsat as a transistor, it is desirable to increase both of the saturation currents Idsat1 and Idsat2 at the same time as much as possible. It is also desirable that the function of the semiconductor element 100 as a channel diode is not deteriorated by the change for increasing the saturation current Isat of the semiconductor element 100 as a transistor. In view of this, the inventors of the present application focused on the channel layer 106, the implanted region 102*i*, and the body region 103 to increase the saturation current Isat while maintaining the function as the channel diode.

Figure 7:
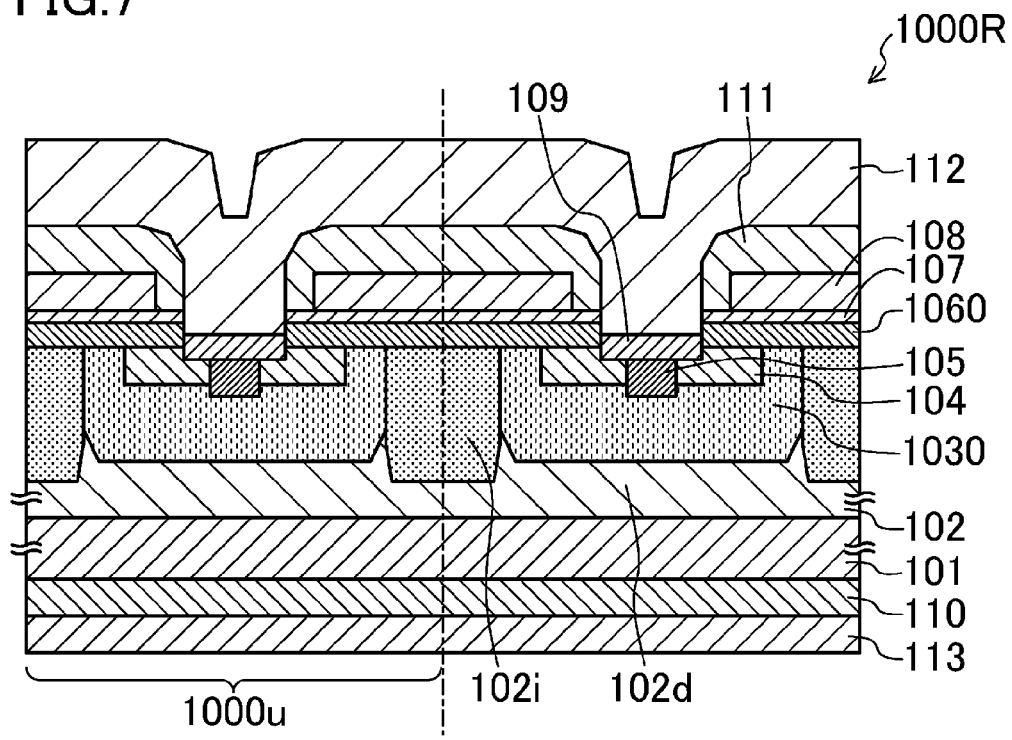
FIG. 7 is a cross section of a semiconductor element (element C) formed as a reference example.

FIG. 7 schematically shows a cross section of a semiconductor element 1000R formed as a reference example for comparison with the semiconductor element 100 of the present embodiment. For simple description, the semiconductor element 100 of the present embodiment may sometimes be referred to as an "element A" and the semiconductor element 1000R of the reference example may sometimes be referred to as an "element C" below. The impurity concentration of a body region 1030 of the element C is approximately the same as the impurity concentration of the first body region 103*a* of the element A. In the element C, the impurity concentration and the thickness of the second silicon carbide semiconductor layer (channel layer) 1060 are adjusted to obtain a desired threshold voltage Vth of the transistor.

Figure 8:
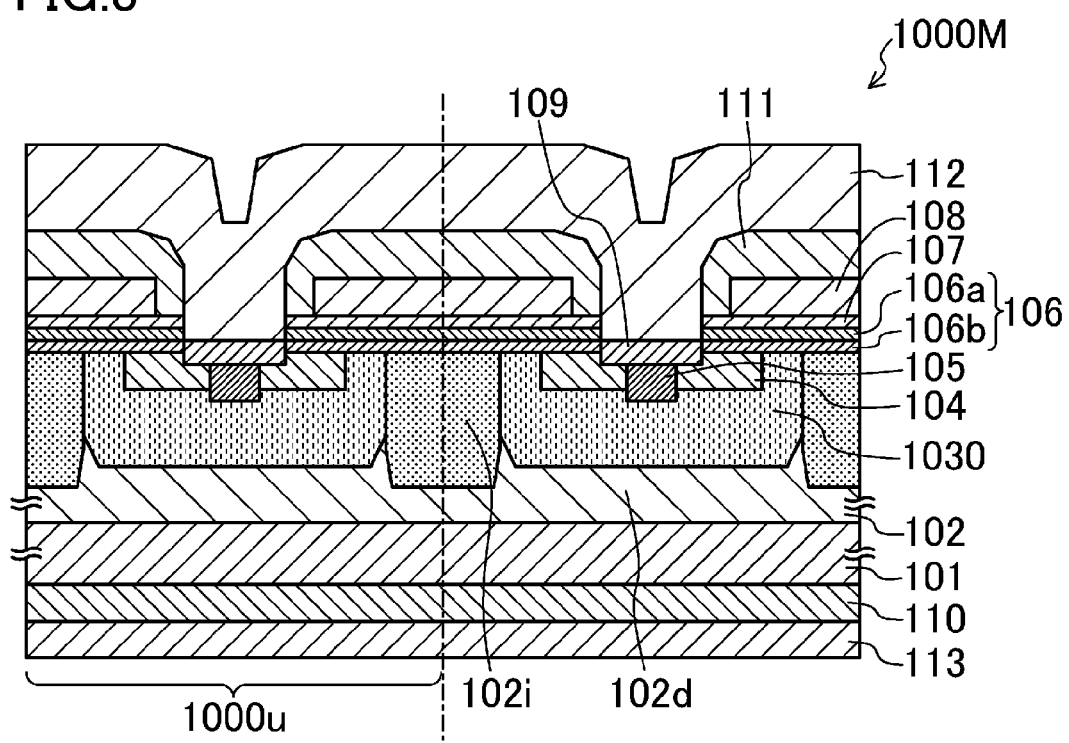
FIG. 8 is a cross section of a semiconductor element (element B) formed as a reference example.

FIG. 8 schematically shows a cross section of a semiconductor element 1000M formed as a reference example for comparison with the element A. For simple description, the semiconductor element 1000M of the reference example may sometimes referred to as an "element B." The element B is a mixture of the configuration of the element A and the configuration of the element C. Specifically, the element B shown in FIG. 8 has a body region 1030 whose configuration is similar to that of the element C, and a second silicon carbide semiconductor layer (channel layer) 106 whose configuration is the same as that of the element A.

Advantages of the semiconductor element 100 (element A) of the present embodiment will be described with reference to the above elements A-C. Specifically, the element C and the element B are compared to each other to explain advantages of the channel layer 106 having impurity concentration distribution of the present embodiment. The element B and the element A are compared to each other to explain advantages of the body region 103 having a multilayered structure of the present embodiment.

Figure 9:
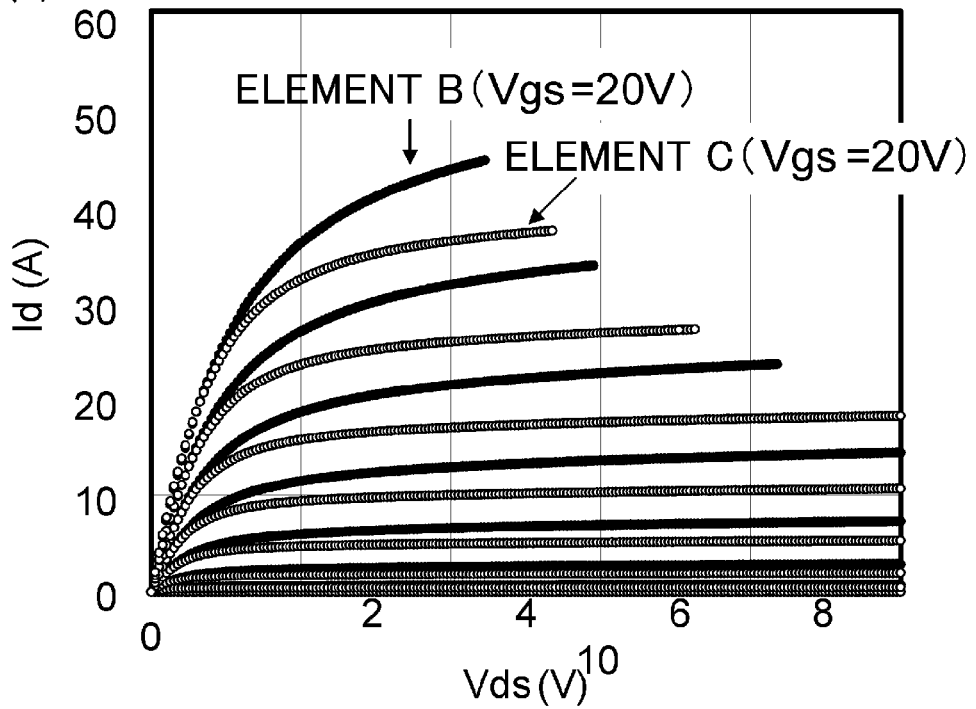
FIG. 9(a) shows a chart comparing transistor characteristics of the element B and the element C.
FIG. 9(b) shows a chart comparing channel diode characteristics of the element B and the element C.
Figure 9:
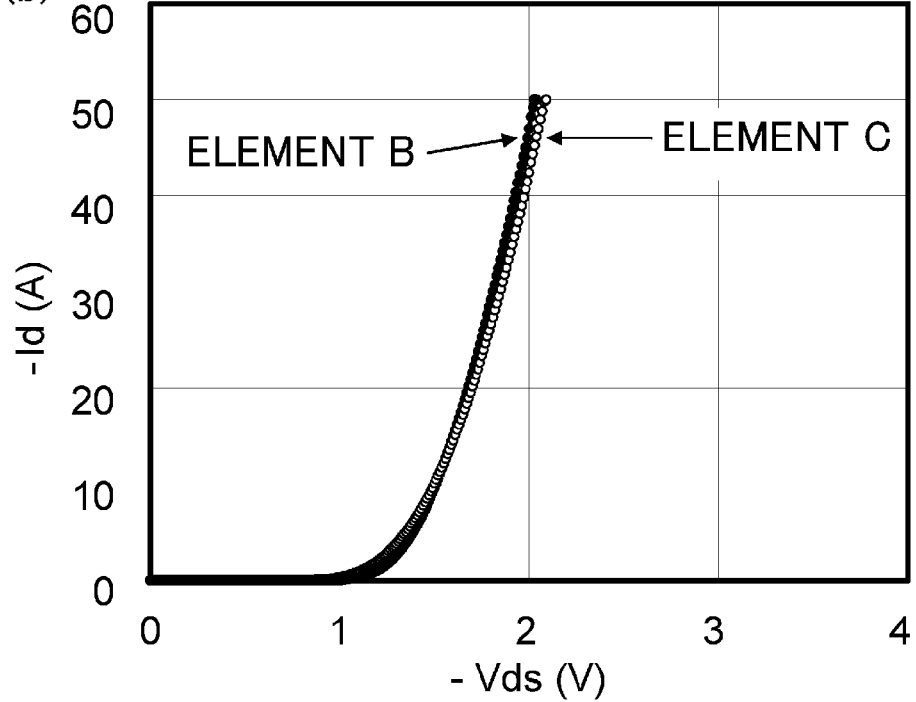

First, the transistor characteristics of the element B and the element C were compared as shown in FIG. 9(*a*). The effective area of the unit cell of each of the transistors was set to about 0.16 cm² so that a large current could be obtained. I-V characteristics of each element were obtained by applying a gate voltage Vgs at 2 V intervals ranging from 0 V to 20 V. The threshold voltage Vth of the transistor characteristics in FIG. 9 was set to about 4 V. The black circles and the white circles represent the element B and the element C, respectively. As apparent from FIG. 9(*a*), there was not a significant difference between the element B and the element C until Vds was close to 1 V. However, in the region of Vds>1V, there was a significant difference in the I-V characteristics between the element B and the element C, that is, the saturation current of the element B was larger than the saturation current of the element C, when the elements were driven at the Vgs of 20 V. The reason why this happened will be described using the expression (1).

Configurations of the element B and the element C are the same, except the configuration of the channel layer 106. Thus, the channel width Wch, the gate insulating film capacity Co, and the channel length Lg in the expression (1) are the same between the element B and the element C. The mobility μch of the channel portion differs between the element B and the element C.

The channel layer 1060 of the element C is made of a single layer with the thickness of about 24 nm and the impurity concentration of $2\times10^{18}$ cm$^{-3}$, for example. In general, in a channel of a MISFET, electrons as carriers pass a channel closer to a gate insulating film in a channel layer. Thus, it appears that in the element C, as well, electrons as carriers pass a channel closer to the gate insulating film 107 in the channel layer 1060.

On the other hand, the channel layer 106 of the element B is made of an upper layer 106*a* which is an undoped layer, and a lower layer 106*b* which is a high-concentration layer. Thus, the carrier channel of the element B may be predominantly formed in the undoped upper layer 106*a*. It is known that, in general, the carrier mobility μch depends on the impurity concentration, and that the higher the impurity concentration is, the more the mobility decreases. This is mainly because the carriers are diffused by the impurity. Thus, it appears that due to the channel layer 106 having the upper layer 106*a* with less carrier diffusion, the carrier mobility μch of the element B can be increased, and the saturation current of the transistor can accordingly be larger than the saturation current of the element C.

It appears that the multilayered structure of the channel layer has no adverse effect on the diode characteristics. FIG. 9(*b*) shows the channel diode characteristics of the element B and the element C in the case of Vgs=0 V. For example, currents of the diodes of the element C and the element B are almost equal to each other in the case of Vds=−2 V. This means that the channel diode characteristics can be advantageously maintained by the multilayered structure of the channel layer, while increasing the saturation current of the MISFET.

Figure 10:
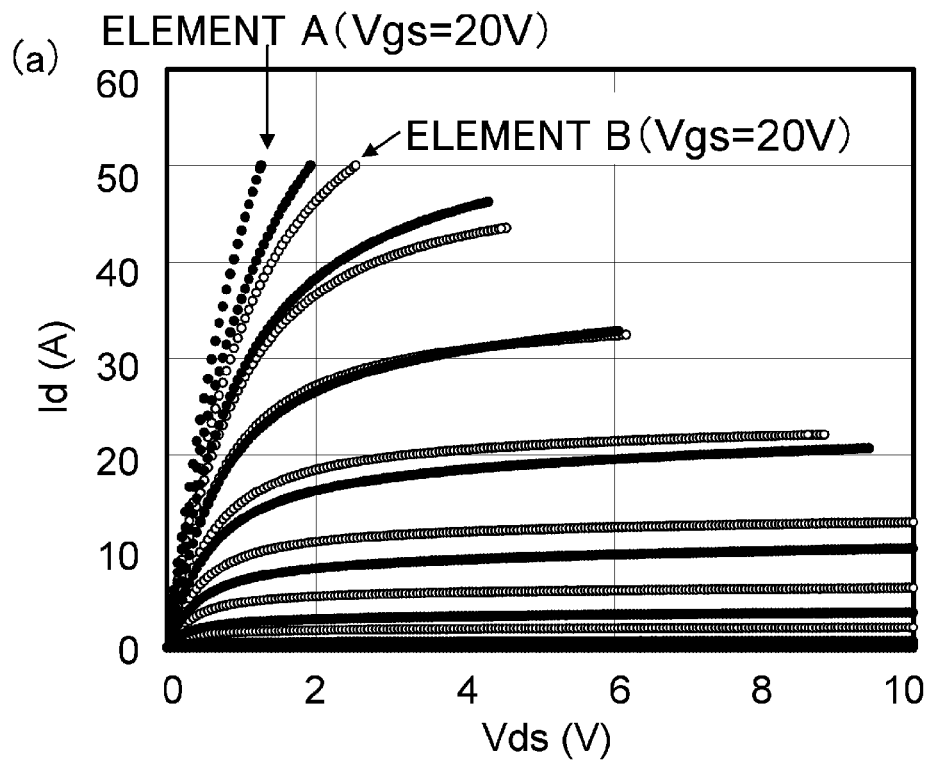
FIG. 10(a) shows a chart comparing transistor characteristics of a semiconductor element (element A) according to an embodiment of the present disclosure and the element B of the reference example.
FIG. 10(b) shows a chart comparing channel diode characteristics of the element A and the element B.
Figure 10:
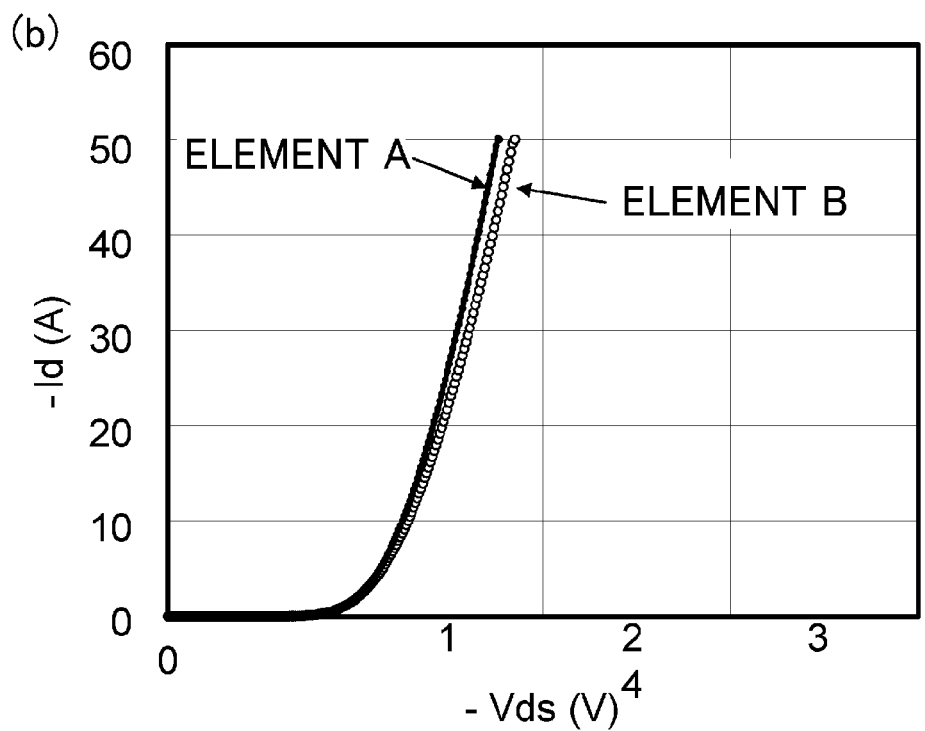

The saturation current does not only depend on the carrier mobility μch of the channel layer 106, but also depends on the characteristics of the JFET region 102*j*. FIG. 10(*a*) shows comparison between transistor characteristics of the element B and the element A. FIG. 10(*b*) shows comparison between channel diode characteristics of the element B and the element A. The threshold voltage Vth of each of the element A and the element B in the transistor characteristics of FIG. 10(*a*) was set to about 3 V. In FIG. 10(*a*) and FIG. 10(*b*), the black circles and the white circles represent the element A and the element B, respectively. As apparent from FIG. 10(*a*), the saturation current of the element A is more improved than the saturation current of the element B in the case where Vgs of 20 V is applied. This will be explained using the expression (2).

The channel layers of both of the element A and the element B have multilayered structures. Thus, the saturation current Idsat2 near the JFET region 102*j* will be described below. The mobility μj in the JFET region 102*j*, the interval a between adjacent two body regions 103 and 1030, the impurity concentration Nj of the JFET region 102*j*, and the length W of the channel width as the JFET region 102*j* are almost the same between the element A and the element B. On the other hand, the body region 103 of the element A has a multilayered structure, which is different from the configuration of the body region 1030 of the element B. In the body region 103 of the element A, the impurity concentration of the first body region 103a is set to be nearly equal to the impurity concentration of the body region 1030 of the element B. In the element A, the impurity concentration of the second body region 103b is lower than the impurity concentration of the first body region 103a. Thus, the impurity concentration of the second body region 103b of the element A is lower than the impurity concentration of the body region 1030 of the element B.

Since the body region 103 of the element A has a multilayered structure, the JFET region 102j is divided into upper and lower portions in a direction perpendicular to the semiconductor substrate 101, from the boundary between the first body region 103a and the second body region 103b, and the upper and lower portions will be considered separately. That is, the JFET region 102j is divided into an upper area sandwiched between the first body regions 103a, and a lower area sandwiched between the second body regions 103b. First, the upper area of the JFET region 102j (i.e., a JFET region sandwiched between the first body regions 103a) will be considered. The element configuration (the impurity concentration) of this area is the same between the element A and the element B. Therefore, there seems to be not a significant difference in parameters which determine the saturation current Idsat2 between the are element A and the element B, if the parameters are limited to only this area.

Turning to the lower area of the JFET region 102j, there is a significant difference in the saturation current Idsat2. The mobility μj and the impurity concentration Nj of the JFET region 102j are determined mainly by the impurity concentration of the implanted region 102i; thus, there is not a difference between the element A and the element B. Further, in the case, for example, where the implanted region 102i is not formed, the mobility μj and the impurity concentration Nj of the JFET region 102j are determined mainly by the impurity concentration of the drift layer 102; thus, there is not a difference between the element A and the element B. The length W of the channel width is not different between the element A and the element B, as well, because the design of the body region viewed from above the substrate is the same between the element A and the element B. The depths Lp of the body regions 103 and 1030 seem to be almost the same between the element A and the element B.

However, when the element A and the element B are compared to each other, a difference is found in a region of the JFET region 102j where a current substantially flows (This region is defined as an effective JFET region). The effective JFET region is a region of the JFET region 102j which is not affected by the depletion layer expanding from the body regions 103 and 1030 to the JFET region 102j. That is, the interval a of the adjacent two body regions 103 in the above expression (2) is defined substantially by the width of the effective JFET region.

The impurity concentration differs between the second body region 103b of the element A and the body region 1030 of the element B. Due to the difference in impurity concentration between the body regions 103 and 1030, the width a of the effective JFET region differs between the element A and the element B. The effective saturation current Idsat2 in the JFET region 102j can be increased with an increase in the width a of the effective JFET region. In the element B, the depletion layer expanding in the JFET region 102j extends from a side surface of the body region 1030 toward the JFET region 102j. On the other hand, in the element A, the expansion of the depletion layer expanding in the JFET region 102j is smaller in the area extending from the second body region 103b toward the JFET region 102j than in the area extending from the first body region 103a toward the JFET region 102j, because the impurity concentration of the second body region 103b of the element A is lower than the impurity concentration of the body region 1030 of the element B. Accordingly, the width a of the effective JFET region can be greater in the element A than in the element B. Further, in order to further increase the width a of the effective JFET region, the second body region 103b, which can provide a wider effective JFET region, relative to the depth Lp of the body region 103 may be enlarged (i.e., the depth of the second body region 103b relative to the depth Lp of the body region 103 may be increased) as much as possible. If the body region 103 as a whole is considered, the body region 103 of the element A includes the second body region 103b whose impurity concentration is lower than the body region 103 of the element B, and it is therefore possible to ensure a wider interval a. As a result, it is possible to increase the saturation current Idsat2 in the JFET region 102j.

The channel diode characteristics of the element A and the element B are as shown in FIG. 10(b). Larger current flows in the diode of the element A than in the diode of the element B. This is the above-mentioned effect of the effective JILT region. That is, because the width a of the effective JFET region is wider in the element A, the JFET region 102j has less resistance component, and the on resistance of the channel diode is accordingly reduced.

The turn-on voltage of the channel diode of the element A, which is an example of the present embodiment, was about 0.6 V at a room temperature. The turn-on voltage of the body diode at a room temperature is 2.5 V or more. Since the turn-on voltage of the channel diode of the element A is sufficiently smaller than the turn-on voltage of the body diode, the current of the diode flows to the channel layer without flowing in the pn junction comprising the body diode. It is therefore possible to reduce development of the crystal deterioration of the SiC semiconductor element, and maintain high reliability of the SiC semiconductor element.

Now, characteristics of the channel diode of the element A of the present embodiment and characteristics of the transistor will be compared. As shown in the graph of transistor characteristics of FIG. 10(a), in the element A, the transistor is in the on state when Vgs is 20 V, and Id1 is 43 A in the on state wherein Id1 is a drain current when Vds is 1 V. On the other hand, as shown in the graph of the diode characteristics of FIG. 10(b), −Vds may be set to 1.7 V in order to allow a current whose absolute value is nearly equal to Id1 to flow in the channel diode of the element A. That is, in the element A, it is possible to allow a current having the same current value as the current flowing when the transistor is on, to flow in the channel diode. Further, a voltage (−1.7 V) that is necessary to allow such a large current to flow in the channel diode is obviously larger than a value of Vds (about −2.5 V in this example) which may possibly turn the body diode on. In other words, in the element A of the present embodiment, no current at all flows in the body diode of the element A even when a sufficiently large current flows in the channel diode. It is therefore possible to reduce development of crystal deterioration of the SiC semiconductor element, and maintain high reliability of the SiC semiconductor element.

In order to prevent a current to flow in the body diode, Vds for obtaining the on current |Id1| of the channel diode may satisfy Vds>−2.5 V. Further, the absolute value of this value may be even smaller, and if it is Vds>−2.0 V, it is possible to reduce conduction loss of the on-state current when the current flows in the channel diode.

As described above, in the semiconductor element of the present embodiment, channel diode characteristics can be improved while increasing both of the saturation currents Idsat1 and Idsat2. Thus, the semiconductor element of the present embodiment is a superior MISFET that contains a freewheeling diode therein.

In the above description, an example was described in which Id1 is a drain current when Vgs is 20 V and Vds is 1 V. However, the drain current Id1 may be defined as a current which flows when a sufficient Vgs is applied to make the transistor on and when Vds is 1 V. The Vgs at this time may be determined, for example, based on the thickness of the gate oxide film, or may be determined according to Vgs=tox×3×$10^6$ V (>Vth) wherein "tox" (cm) is the thickness of the gate insulating film.

<Variation of Implanted Region 102$i$>

Figure 11:
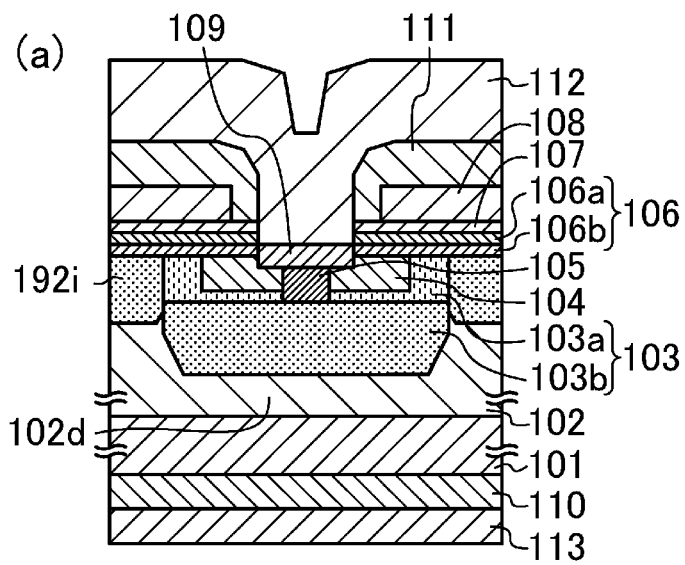
FIG. 11(a) is a cross section showing the first variation of an implanted region of the semiconductor element.
FIG. 11(b) shows a cross section of the second variation.
Figure 11:
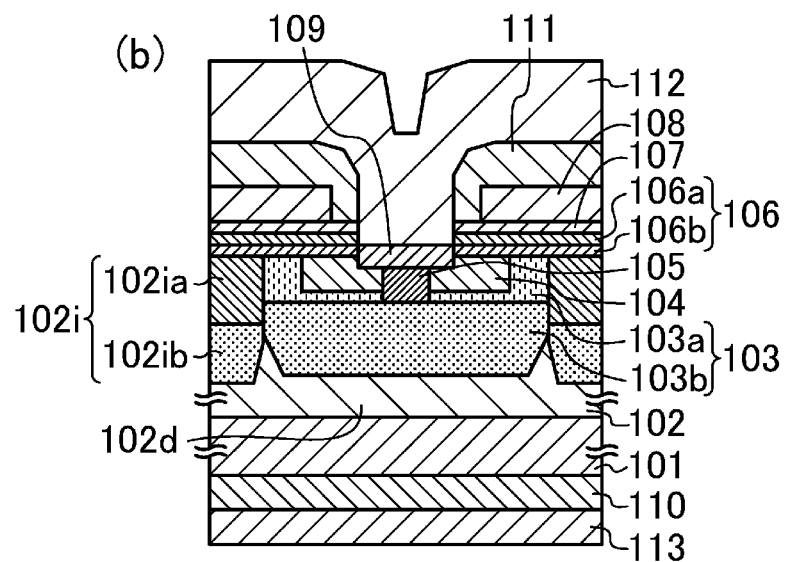

In the semiconductor element 100 of the present embodiment, the implanted region 102$i$ is formed to have a depth approximately equal to a depth below the body region 103. However, in order to ensure an effective interval a (a width of the effective JFET region) between adjacent body regions in the saturation current Idsat2 near the JFET region 102$j$, an implanted region 192$i$ may be formed to have a depth deeper than at least the depth of the first body region 103$a$ as shown in FIG. 11($a$). Thus, the effective interval a can be ensured between adjacent two first body regions 103$a$ whose impurity concentration is higher than the impurity concentration of the second body region 103$b$.

Further, as shown in FIG. 11($b$), the implanted region 102$i$ may be divided into a first implanted region 102$ia$ and a second implanted region 102$ib$ which have different impurity concentrations. Since the implanted region 102$i$ is formed mainly by impurity implantation, it is difficult to clearly differentiate between the first implanted region and the second implanted region. Thus, the impurity implantation for forming the first implanted region and the impurity implantation for forming the second implanted region may be performed at different energy to generate at least two peaks of concentration, and a boundary between these two peaks of concentration may be defined to divide the implanted region 102$i$ into two regions. In this case, the impurity concentration of the first implanted region 102$ia$ is set to be higher than the impurity concentration of the second implanted region 102$ib$. The depth of the first implanted region 102$ia$ may be deeper than at least the depth of the first body region 103$a$, similar to the implanted region 192$i$. This configuration reduces expansion of a depletion layer toward the JFET region 102$j$, thereby making it possible to maintain a large effective interval a between the first implanted regions 102$ia$, and between the second implanted region 102$ib$, of the JFET region 102$j$. As a result, a semiconductor element with a larger saturation current can be achieved. For example, the impurity concentration of the first implanted region 102$ia$ may be twice or more the impurity concentration of the second implanted region 102$ib$. If the impurity concentration of the second implanted region 102$ib$ is $1\times10^{17}$ cm$^{-3}$ or so, the impurity concentration of the first implanted region 102$ia$ may be $2\times10^{17}$ cm$^{-3}$ or more.

Figure 12:
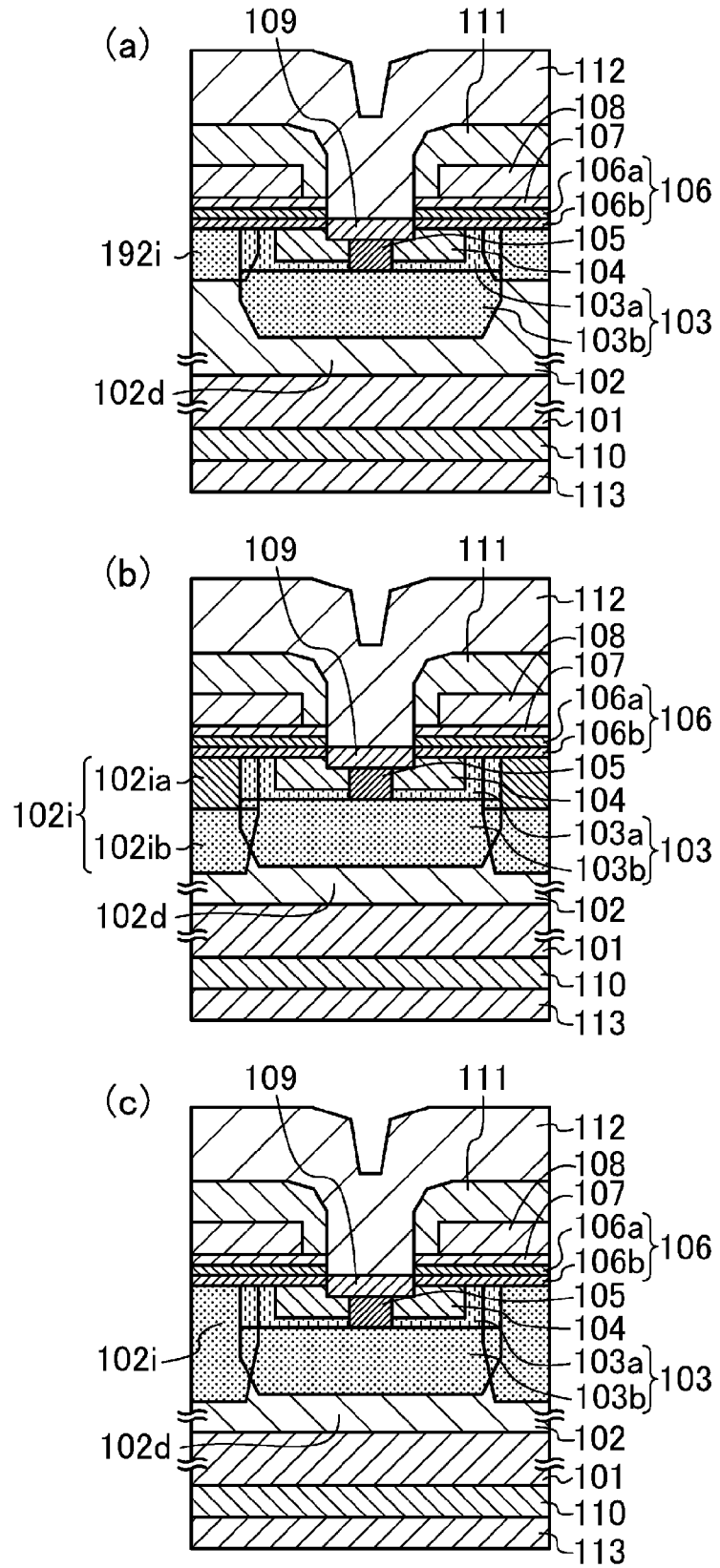
FIG. 12(a) is a cross section showing the third variation of the implanted region.
FIG. 12(b) is a cross section showing the fourth variation of the implanted region.
FIG. 12(c) is a cross section showing the fifth variation of the implanted region.
Figure 13:
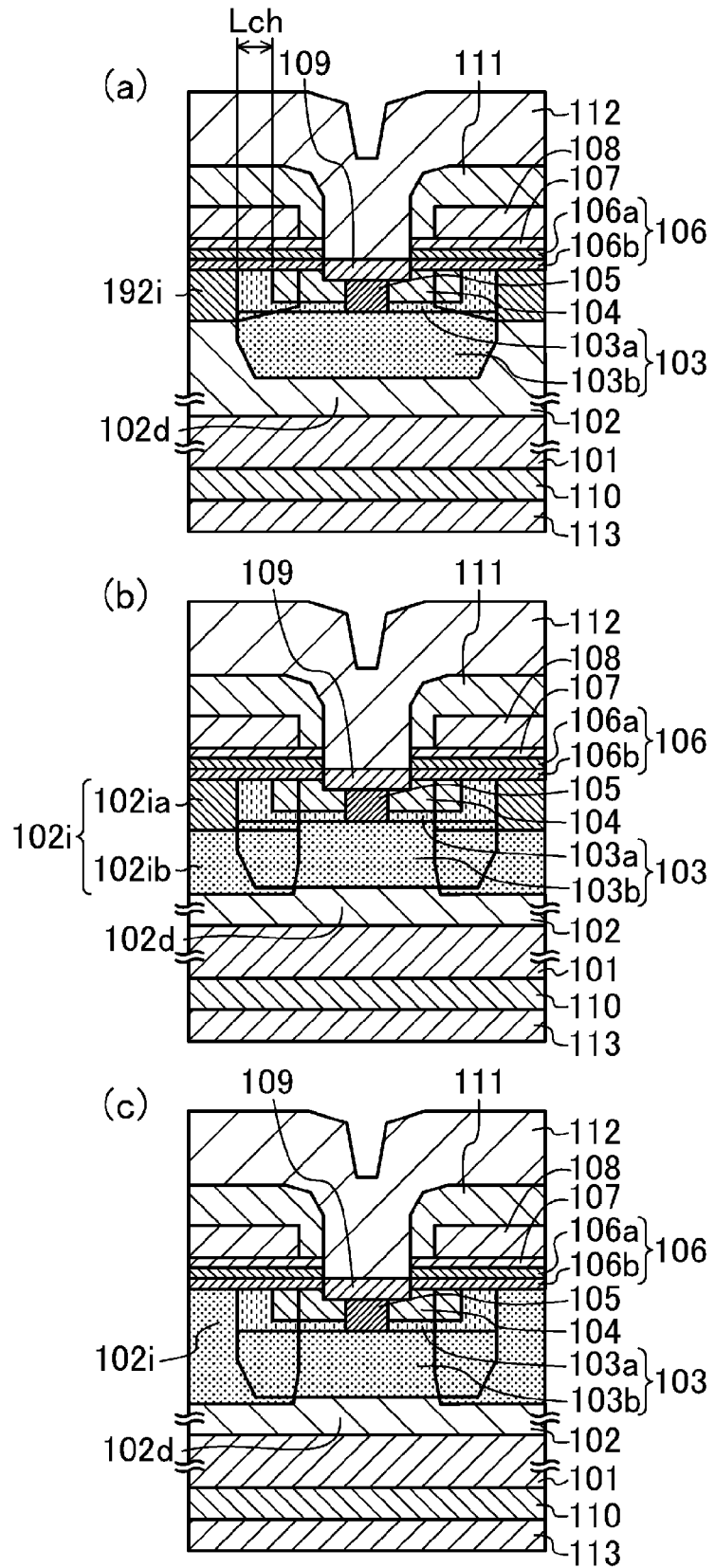
FIG. 13(a) is a cross section showing the sixth variation of the implanted region.
FIG. 13(b) is a cross section showing the seventh variation of the implanted region.
FIG. 13(c) is a cross section showing the eighth variation of the implanted region.

In the semiconductor element 100 of the present embodiment, the implanted region 102$i$ is adjacent to the first body region 103$a$. However, the above-described effective interval a may be reduced when pattern misalignment occurs in forming the first body region 103$a$ and the implanted region 102$i$. In the event that the pattern misalignment occurs and a gap is formed between the first body region 103$a$ and the implanted region 102$i$, the first silicon carbide semiconductor layer 102 near the JFET region 102$j$ is exposed at the gap. The impurity concentration of the first silicon carbide semiconductor layer 102 is lower than the impurity concentration of the implanted region 102$i$. Therefore, a depletion layer extending from the first body region 103$a$ easily extends into this gap, which reduces the effective interval a corresponding to the gap. This may reduce the saturation current during on time of the MISFET. For this reason, as shown in FIGS. 12($a$), 12($b$) and 12($c$), the first body region 103$a$, the implanted region 192$i$ (or 102$ia$), and the implanted region 102$i$ may overlap one another. The amount of the overlap may be NA or more, where A is misalignment relative to a reference location in forming the implanted region and the body region. As a result, it is possible to reduce a reduction of the effective interval a caused by the pattern misalignment. The amount of overlap may of course be larger than the channel length Lch, as shown in FIG. 13($a$)-13($c$).

In the semiconductor element of the present embodiment, the impurity concentration of the first body region 103$a$ is set to be $1\times10^{18}$ cm$^{-3}$ or more, for example. Further, the impurity concentrations of the implanted regions 192$i$, 102$ia$ and 102$i$ are set to be smaller than the impurity concentration of the first body region 103$a$ by more than an order of magnitude (that is, $1\times10^{17}$ cm$^{-3}$ or less if the impurity concentration of the first body region 103$a$ is $1\times10^{18}$ cm$^{-3}$). It is therefore possible to reduce an effect on the impurity concentration of the body region having a channel length Lch which defines the channel region. As a result, the threshold voltages Vth of the semiconductor elements shown in FIG. 12 and FIG. 13 can be set to desired values, and it is possible to provide semiconductor elements with a large saturation current and capable of allowing a flow of a large on-state current of the channel diode in the reverse direction.

(Variation of Embodiment)

A semiconductor element of a variation of an embodiment of the present disclosure will be described with reference to the drawings.

Figure 14:
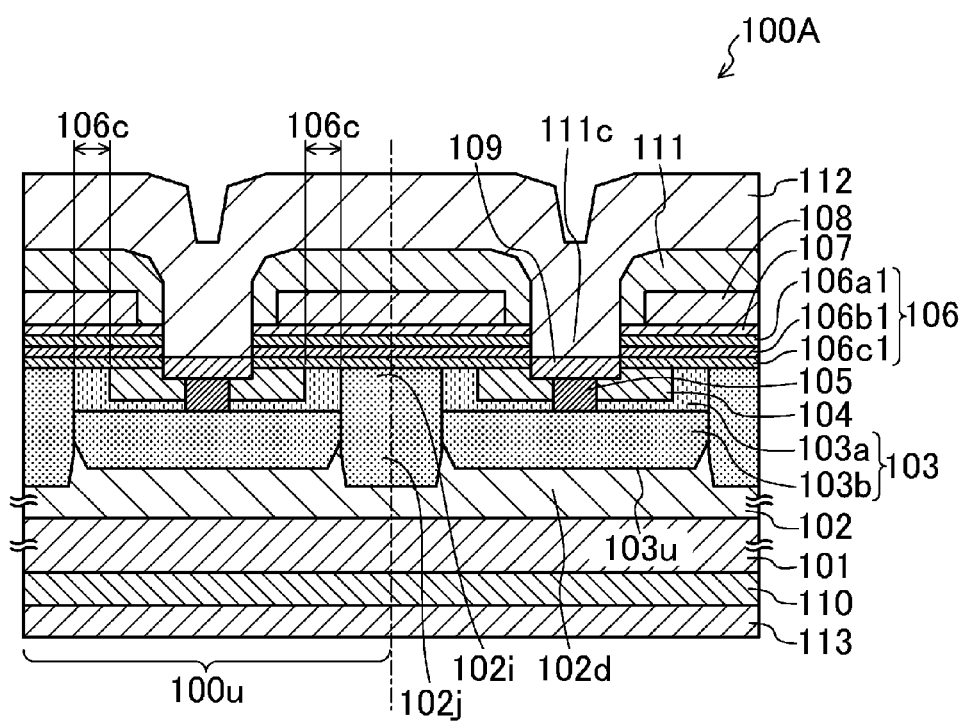
FIG. 14 is a cross section of a semiconductor element of a variation of the embodiment of the present disclosure.

FIG. 14 schematically shows a cross-sectional configuration of a semiconductor element 100A of the present variation. FIG. 14 shows a schematic cross section of two unit cells 100$u$, connected in parallel to each other, of a vertical MISFET using SiC. Commercially available semiconductor element 100A includes a plurality of unit cells 100$u$. In FIG. 14, like reference characters have been used to designate the same elements as those shown in FIG. 1.

<Configuration of Semiconductor Element 100A>

As shown in FIG. 14, the semiconductor element 100A of the present variation is provided on a first silicon carbide semiconductor layer 102 of a first conductivity type, that is, n-type in this example, and an n-type second silicon carbide semiconductor layer (i.e., a channel layer) 106, which is in contact with at least part of each of a body region 103 and an impurity region 104, has a three-layered structure (e.g., 106$a$1, 106$b$1 and 106$c$1).

Differences of the semiconductor element 100A of the present variation from the semiconductor element 100 of the embodiment shown in FIG. 1 will be described below.

Similar to the above-described embodiment, the second silicon carbide semiconductor layer 106 is electrically connected to a JFET region 102$j$ adjacent to a first body region 103$a$, of the impurity region 104 and the first silicon carbide semiconductor layer 102, and is provided on the first body region 103$a$.

In the present variation, the second silicon carbide semiconductor layer 106 is formed by epitaxial growth. The second silicon carbide semiconductor layer 106 is located in contact with the impurity region 104, the first body region 103a, and the JFET region 102j. In the example shown in FIG. 14, the second silicon carbide semiconductor layer 106 is provided on the impurity region 104, the first body region 103a, and the JFET region 102j. The second silicon carbide semiconductor layer 106 includes a channel region 106c in a region contacting the first body region 103a. In the present variation, as well, the length of the channel region 106c (channel length L) corresponds to the length indicated by the two bidirectional arrows shown in FIG. 14.

The impurity concentration of the second silicon carbide semiconductor layer (a channel layer) 106 distributes in a direction perpendicular to the semiconductor substrate 101. Specifically, the second silicon carbide semiconductor layer 106 includes a third region whose impurity concentration is higher than the impurity concentration of a first region in contact with a gate insulating film 107 and the impurity concentration of a second region in contact with the first body region 103a.

For simple description, an example in which the second silicon carbide semiconductor layer 106 has a three-layered structure will be described below. One of the three layers of the second silicon carbide semiconductor layer 106 which is in contact with the body region 103 (the impurity region 104) is referred to as a lower layer 106c1; the layer above the lower layer 106c1 is referred to as an intermediate layer 106b1; and the layer above the intermediate layer 106b1 is referred to as an upper layer 106a1. The second silicon carbide semiconductor layer 106 is formed by epitaxial growth. The impurity concentration of the second silicon carbide semiconductor layer 106 is controlled mainly by a flow rate of doping gas in the epitaxial growth. In this example, the doping gas is introduced to intentionally change the impurity concentration, thereby sequentially forming the lower layer 106c1, the intermediate layer b1, and the upper layer 106a1. The lower layer 106c1 of the second silicon carbide semiconductor layer 106 is, for example, in undoped state in which the impurity concentration is significantly low. The intermediate layer 106b1 of the second silicon carbide semiconductor layer 106 has an n-type impurity. The upper layer 106a1 of the second silicon carbide semiconductor layer 106 is, for example, in undoped state in which the impurity concentration is significantly low. The boundaries between adjacent ones of the upper layer 106a1, the intermediate layer 106b1, and the lower layer 106c1 are defined by two boundaries where the impurity concentrations are discontinuously changed, for example. Of the two boundaries, a portion above the boundary close to gate insulating film 107 is the upper layer 106a1; a portion below the boundary close to the region 103 is the lower layer 106c1; and a portion between the two boundaries is the intermediate layer 106b1. A first boundary where the impurity concentration increases in a direction from the lower layer 106c1 to the intermediate layer 106b1, and a second boundary where the impurity concentration decreases in a direction from the intermediate layer 106b1 to the upper layer 106a1 are selected.

When such boundaries are selected, the impurity concentration of the intermediate layer 106b1 is higher than the impurity concentration of each of the lower layer 106c1 and the upper layer 106a1. Thus, the lower layer 106c1 and the upper layer 106a1 are low-concentration layers, and the intermediate layer 106b1 is a high-concentration layer. In the case where the impurity concentration continuously changes in the second silicon carbide semiconductor layer (a channel layer) 106, a portion having an arbitrary depth (e.g., 10 nm) from the surface closer to the gate insulating film 107 is defined as the upper layer 106a1, and the thickness of the lower layer 106b1 is also determined to be 10 nm, for example, and the other portion is defined as the intermediate layer 106b1. In this case, as well, the impurity concentration of the intermediate layer 106b1 is higher than the impurity concentration of each of the lower layer 106b and the upper layer 106a1.

The configurations other than the configuration of the second silicon carbide semiconductor layer 106 are equal to the configurations of the semiconductor element 100 shown in FIG. 1. Further, variations of the semiconductor element 100 can be applied to the semiconductor element 100A of the present variation, as well.

<Operation and Advantages of Semiconductor Element 100A>

Now, operation of the semiconductor element 100A will be described.

Similar to the already-mentioned semiconductor element 100, the semiconductor element 100A functions as a MISFET and also functions as a channel diode. The only difference from the semiconductor element 100 is a layer structure of the channel layer 106, but when viewed from the gate insulating film 107 side, the magnitude of impurity concentrations between the upper layer 106a and the lower layer 106b of the semiconductor element 100 and the magnitude of impurity concentrations between the upper layer 106a1 and the intermediate layer 106b1 of the semiconductor element 100A are similar to each other. The channel layers 106 of the semiconductor elements 100 and 100A include the upper layer 106a or 106a1 which is an undoped layer, and the lower layer 106b or the intermediate layer 106b1 which is a high-concentration layer, and it is considered that a carrier channel is predominantly formed in the upper layer 106a or 106a1 which is an undoped layer. It is known that, in general, the carrier mobility μch depends on the impurity concentration, and that the higher the impurity concentration is, the more the mobility decreases. This is mainly because the carriers are diffused by the impurity. Thus, it appears that due to the channel layer 106 having the upper layer 106a or 106a1 with less carrier diffusion, the carrier mobility μch of each of the semiconductor elements 100 and 100A can be increased, and the saturation current of the transistor can accordingly be larger.

The big difference between the semiconductor elements 100 and 100A is whether there is a lower layer 106c1 or not. The provision of the lower layer 106c1 can reduce variations in characteristics of the semiconductor element 100A when a plurality of semiconductor elements 100A are formed on a semiconductor wafer (e.g., 3 inches). This happens because the channel layer 106 is formed by epitaxial growth. The channel layer 106 needs to be deposited to obtain the semiconductor element 100. However, in the early stage of the deposition of the channel layer 106, supply of impurity gas and crystal growth of the lower layer 106b become unstable in the early stage of growth of the lower layer 106b, and impurities may sometimes be localized at a lower end of the lower layer 106b (at an interface between the lower layer 106b and the first body region 103a). The localized impurities may increase the impurity concentration of the lower end of the lower layer 106b to be significantly higher than a desired value. This layer is called a "localized layer" for convenience. It is difficult to form the localized layer with good reproducibility and stability. Even if a flow rate of the impurity gas (nitrogen in this example) used in doping of the lower layer 106b is stabilized, distribution occurs in the wafer and as a result, distribution of a dose amount and a thickness of the impurities in the channel layer 106 is increased if the channel layer 106 as a whole is considered. As a result, the electrical characteristics of the plurality of semiconductor elements 100 formed on the wafer may significantly vary. On the other hand, in the semiconductor element 100A in which another lower layer 106c1 is provided under the lower layer 106b, impurity gas is not introduced in the early stage of growth of the channel layer 106 (i.e., in the early stage of growth of the lower layer 106c1), and therefore, the above-mentioned localized layer is not formed. As a result, distribution of a dose amount and a thickness of the impurities in the channel layer 106 can be small, and variations in the electrical characteristics of the semiconductor elements 100A formed on the wafer can be reduced.

In the above description, the silicon carbide is 4H—SiC, but other polytype silicon carbide (e.g., 6H—SiC, 3C—SiC, and 15R—SiC) may also be used. Further, in the above description, the principal surface is an off-cut surface from a (0001) plane, but may be another plane, such as (11-20) plane, (1-100) plane, and (000-1) plane), or an off-cut plane from these planes. Further, the substrate may be made of Si, and the drift layer may be made of silicon carbide (3C—SiC), thereby providing a heterojunction.

INDUSTRIAL APPLICABILITY

The present disclosure can be widely applied to semiconductor elements such as a SiC-MISFET, and to various control devices and driving devices such as an inverter circuit that includes the semiconductor element.

DESCRIPTION OF REFERENCE CHARACTERS 100 semiconductor element
100A semiconductor element
100u unit cell
101 semiconductor substrate
102 first silicon carbide semiconductor layer (drift layer)
102j JFET region
102i implanted region
102ia first implanted region
102ib second implanted region
103 body region
103a first body region
103b second body region
103u bottom surface
104 impurity region
105 contact region
106 second silicon carbide semiconductor layer
106a upper layer of second silicon carbide semiconductor layer
106b lower layer of second silicon carbide semiconductor layer
106c channel region
106a1 upper layer of second silicon carbide semiconductor layer
106b1 intermediate layer of second silicon carbide semiconductor layer
106c1 lower layer of second silicon carbide semiconductor layer
107 gate insulating film
108 gate electrode
109 source electrode (first ohmic electrode)
110 drain electrode (second ohmic electrode)
111 interlayer insulating film
112 upper electrode
113 back electrode
192i implanted region

The invention claimed is:

1. A semiconductor element, comprising:
a semiconductor substrate of a first conductivity type;
a first silicon carbide semiconductor layer of the first conductivity type located on a principal surface of the semiconductor substrate;
a body region of a second conductivity type located in the first silicon carbide semiconductor layer;
an impurity region of the first conductivity type located in the body region;
a second silicon carbide semiconductor layer of the first conductivity type which is located on the first silicon carbide semiconductor layer and is in contact with at least part of the body region and at least part of the impurity region;
a gate insulating film on the second silicon carbide semiconductor layer;
a gate electrode on the gate insulating film;
a first ohmic electrode electrically connected to the impurity region; and
a second ohmic electrode provided on a back surface of the semiconductor substrate, wherein
the body region of the second conductivity type includes, in a portion under the gate electrode, a first body region in contact with a surface of the first silicon carbide semiconductor layer, and a second body region in contact with a bottom surface of the body region of the second conductivity type, and an impurity concentration of the first body region is twice or more an impurity concentration of the second body region, and
the second silicon carbide semiconductor layer of the first conductivity type has an impurity concentration distribution in a direction perpendicular to the semiconductor substrate, and an impurity concentration on a side in contact with the gate insulating film is lower than an impurity concentration on a side in contact with the first body region.

2. The semiconductor element of claim 1, wherein
the second silicon carbide semiconductor layer of the first conductivity type includes a low-concentration layer in contact with the gate insulating film, and a high-concentration layer located under the low-concentration layer and having an impurity concentration higher than an impurity concentration of the low-concentration layer.

3. The semiconductor element of claim 1, comprising:
an implanted region of the first conductivity type located between at least two body regions adjacent to each other, wherein
the implanted region is deeper than the first body region.

4. The semiconductor element of claim 3, wherein
the implanted region is deeper than the second body region.

5. The semiconductor element of claim 3, wherein
the implanted region is shallower than the second body region.

6. The semiconductor element of 3, wherein
at least part of the implanted region overlaps the first body region, when viewed from the direction perpendicular to the semiconductor substrate.

7. The semiconductor element of claim 6, wherein
at least part of the implanted region overlaps the impurity region, when viewed from the direction perpendicular to the semiconductor substrate.

8. The semiconductor element of 3, wherein
the implanted region includes a first implanted region and a second implanted region in contact with a bottom surface of the implanted region, and an impurity concentration of the first implanted region is twice or more an impurity concentration of the second body region.

9. The semiconductor element of claim 8, wherein
the implanted region is formed in a continuous manner by controlling a dose amount and dose energy of ion implantation.

10. The semiconductor element of claim 1 wherein
electric potentials applied to the second ohmic electrode and the gate electrode relative to a potential of the first ohmic electrode are Vds and Vgs, respectively, and a gate threshold voltage is Vth,
in the case of Vgs≥Vth, a current flows from the second ohmic electrode to the first ohmic electrode via the second silicon carbide semiconductor layer, and
in the case of 0 V≤Vgs<Vth, with a decrease in Vds from 0 V, a current flows from the first ohmic electrode to the second ohmic electrode via the second silicon carbide semiconductor layer before a current starts to flow from the body region to the first silicon carbide semiconductor layer.

11. The semiconductor element of claim 1, wherein
the semiconductor substrate, the first silicon carbide semiconductor layer, the body region, the impurity region, the second silicon carbide semiconductor layer, the gate insulating film, the gate electrode, the first ohmic electrode, and the second ohmic electrode form a metal-insulator-semiconductor field-effect transistor,
an electric potential of the second ohmic electrode relative to a potential of the first ohmic electrode is Vds; an electric potential of the gate electrode relative to the potential of the first ohmic electrode is Vgs; a gate threshold voltage of the metal-insulator-semiconductor field-effect transistor is Vth; a direction of a current flowing from the second ohmic electrode to the first ohmic electrode is defined as a forward direction; and a direction of a current flowing from the first ohmic electrode to the second ohmic electrode is defined as a reverse direction,
in the case of Vgs≥Vth, the metal-insulator-semiconductor field-effect transistor allows conduction between the second ohmic electrode and the first ohmic electrode via the second silicon carbide semiconductor layer,
in the case of 0 V≤Vgs<Vth, the metal-insulator-semiconductor field-effect transistor does not allow a current to flow in the forward direction, and in the case of Vds<0 V, the metal-insulator-semiconductor field-effect transistor functions as a diode allowing a current to flow in the reverse direction from the first ohmic electrode to the second ohmic electrode via the second silicon carbide semiconductor layer, and
an absolute value of a turn-on voltage of the diode is smaller than an absolute value of a turn-on voltage of a body diode comprised of the body region and the first silicon carbide semiconductor layer.

12. The semiconductor element of claim 11, wherein
a current which flows from the second ohmic electrode to the first ohmic electrode in the metal-insulator-semiconductor field-effect transistor in the case of Vgs>Vth and Vds=1 V, is Id1, and
in the case of Vgs=0, with a decrease in Vds from 0 V, a current flows from the first ohmic electrode to the second ohmic electrode via the second silicon carbide semiconductor layer, and
before Vds becomes smaller than the turn-on voltage of the body diode, a current of a current value |Id1| flows from the first ohmic electrode to the second ohmic electrode.

13. The semiconductor element of claim 12, wherein
turn-on voltage of the body diode is −2.5 V under a room temperature.

14. The semiconductor element of claim 12, wherein
in the metal-insulator-semiconductor field-effect transistor,
in the case of Vgs=0 V, with a decrease in Vds from 0 V, a current flows from the first ohmic electrode to the second ohmic electrode via the second silicon carbide semiconductor layer, and
before Vds becomes smaller than −2.0 V, a current of a current value |Id1| flows from the first ohmic electrode to the second ohmic electrode under a room temperature.

15. The semiconductor element of claim 12, wherein
the current Id1 is defined as a current which flows from the second ohmic electrode to the first ohmic electrode in the case of Vgs=tox×3×10$^6$ V and Vds=1 V, where tox (cm) is a thickness of the gate insulating film.

16. The semiconductor element of claim 1, wherein
the impurity concentration of the first body region is $1 \times 10^{18}$ cm$^{-3}$ or more and $1 \times 10^{20}$ cm$^{-3}$ or less, and the impurity concentration of the second body region is $1 \times 10^{17}$ cm$^{-3}$ or more and $1 \times 10^{19}$ cm$^{-3}$ or less.

17. The semiconductor element of claim 1, wherein
the first body region and the second body region have thicknesses of 15 nm and 100 nm, respectively, in a direction perpendicular to the principal surface of the semiconductor substrate.

18. The semiconductor element of claim 1, wherein
the first body region and the second body region are continuously formed by controlling a dose amount and dose energy of ion implantation.

19. The semiconductor element of claim 1, wherein
the second silicon carbide semiconductor layer is electrically connected to the impurity region and a region of the first silicon carbide semiconductor layer which is adjacent to the first body region, and the second silicon carbide semiconductor layer is provided on the first body region.

20. The semiconductor element of claim 18, wherein
the second silicon carbide semiconductor layer is formed by epitaxial growth.

21. The semiconductor element of claim 1, wherein
in the second silicon carbide semiconductor layer, the impurity concentration distribution is formed by controlling an impurity gas during the epitaxial growth.

22. The semiconductor element of claim 2, wherein
the impurity concentration of the low-concentration layer is $1 \times 10^{17}$ cm$^{-3}$ or less.

23. The semiconductor element of claim 2, wherein
the impurity concentration of the high-concentration layer is $1 \times 10^{18}$ cm$^{-3}$ or more.

24. A semiconductor element, comprising:
a semiconductor substrate of a first conductivity type;
a first silicon carbide semiconductor layer of the first conductivity type located on a principal surface of the semiconductor substrate;
a body region of a second conductivity type located in the first silicon carbide semiconductor layer;
an impurity region of the first conductivity type located in the body region;
a second silicon carbide semiconductor layer of the first conductivity type which is located on the first silicon carbide semiconductor layer and is in contact with at least part of the body region and at least part of the impurity region;

a gate insulating film on the second silicon carbide semiconductor layer;
a gate electrode on the gate insulating film;
a first ohmic electrode electrically connected to the impurity region; and
a second ohmic electrode provided on a back surface of the semiconductor substrate, wherein
the body region of the second conductivity type includes, in a portion under the gate electrode, a first body region in contact with a surface of the first silicon carbide semiconductor layer, and a second body region in contact with a bottom surface of the body region of the second conductivity type, and an impurity concentration of the first body region is twice or more an impurity concentration of the second body region, and
the second silicon carbide semiconductor layer of the first conductivity type has an impurity concentration distribution in a direction perpendicular to the semiconductor substrate, and includes a first region on a side in contact with the gate insulating film, a second region on a side in contact with the first body region, and a third region of which an impurity concentration is higher than impurity concentrations of the first region and the second region.

25. The semiconductor element of claim 24, wherein in the second silicon carbide semiconductor layer of the first conductivity type,
the first region is a first low-concentration layer in contact with the gate insulating film,
the third region is a high-concentration layer located under the low-concentration layer and having an impurity concentration higher than an impurity concentration of the first low-concentration layer, and
the second region is a second low-concentration layer located under the high-concentration layer and having an impurity concentration lower than the impurity concentration of the high-concentration layer.

26. The semiconductor element of claim 25, wherein
the second silicon carbide semiconductor layer of the first conductivity type is comprised of the first low-concentration layer, the high-concentration layer, and the second low-concentration layer.

27. The semiconductor element of claim 25 wherein
the impurity concentrations of the first low-concentration layer and the second low-concentration layer are $1 \times 10^{17}$ cm$^{-3}$ or less.

* * * * *